(12) United States Patent
Bai et al.

(10) Patent No.: US 11,221,699 B2
(45) Date of Patent: Jan. 11, 2022

(54) SHIFT REGISTER, DRIVING METHOD THEREOF AND DEVICE

(71) Applicants: Chongqing BOE Optoelectronics Technology Co., Ltd., Chongqing (CN); BOE Technology Group Co., Ltd., Beijing (CN)

(72) Inventors: Yajie Bai, Beijing (CN); Zhuo Xu, Beijing (CN); Jingpeng Zhao, Beijing (CN); Wu Wang, Beijing (CN); Xiaoyuan Wang, Beijing (CN); Ruilin Bi, Beijing (CN)

(73) Assignees: Chongqing BOE Optoelectronics Technology Co., Ltd., Chongqing (CN); BOE Technology Group Co., Ltd., Beijing (CN)

(*) Notice: Subject to any disclaimer, the term of this patent is extended or adjusted under 35 U.S.C. 154(b) by 70 days.

(21) Appl. No.: 16/633,204

(22) PCT Filed: Jan. 16, 2019

(86) PCT No.: PCT/CN2019/072035
§ 371 (c)(1),
(2) Date: Jan. 23, 2020

(87) PCT Pub. No.: WO2020/147045
PCT Pub. Date: Jul. 23, 2020

(65) Prior Publication Data
US 2021/0223895 A1    Jul. 22, 2021

(51) Int. Cl.
*G06F 3/041*  (2006.01)
*G09G 3/32*   (2016.01)
*G06F 3/044*  (2006.01)

(52) U.S. Cl.
CPC ...... *G06F 3/0412* (2013.01); *G06F 3/041662* (2019.05); *G09G 3/32* (2013.01);
(Continued)

(58) Field of Classification Search
CPC .. G06F 3/0412; G06F 3/041662; G06F 3/044; G09G 3/32; G09G 2300/0408;
(Continued)

(56) References Cited

U.S. PATENT DOCUMENTS

2015/0355767 A1    12/2015  Abe et al.
2016/0328045 A1    11/2016  Wang et al.
(Continued)

FOREIGN PATENT DOCUMENTS

CN    104795018 A    7/2015
CN    105244005 A    1/2016
(Continued)

*Primary Examiner* — Peter D McLoone
(74) *Attorney, Agent, or Firm* — Arent Fox LLP; Michael Fainberg

(57) ABSTRACT

A shift register, a driving method thereof and a device are provided. A shift register sub-circuit outputs a gate scanning signal, to dive gate lines. The shift register sub-circuit outputs a touch scanning signal to a touch control circuit, so that the touch control circuit conducts a touch electrode with a touch detection signal terminal in response to the touch scanning signal, and thus, touch driving may be performed. Therefore, the shift register provided by the embodiment of the disclosure is not only capable of realizing scanning driving, but also capable of realizing the touch driving of touch electrodes. In addition, the number of arranged touch detection lines may be reduced, and furthermore, the area of a Fan-out region and the area of a non-display region are reduced.

19 Claims, 14 Drawing Sheets

(52) U.S. Cl.
CPC ..... *G06F 3/044* (2013.01); *G09G 2300/0408* (2013.01); *G09G 2300/0852* (2013.01); *G09G 2310/0286* (2013.01); *G09G 2310/061* (2013.01)

(58) Field of Classification Search
CPC ... G09G 2300/0852; G09G 2310/0286; G09G 2310/061
See application file for complete search history.

(56) References Cited

U.S. PATENT DOCUMENTS

2017/0147127 A1   5/2017   Sun
2017/0177158 A1   6/2017   Tu et al.

FOREIGN PATENT DOCUMENTS

CN   106023945 A   10/2016
CN   106484187 A    3/2017

SHIFT REGISTER, DRIVING METHOD THEREOF AND DEVICE

CROSS-REFERENCE TO RELATED APPLICATION

This application is a US National Stage of International Application No. PCT/CN2019/072035, filed on Jan. 16, 2019, which is incorporated herein by reference in its entirety.

FIELD

The disclosure relates to the technical field of display, and particularly to a shift register, a driving method thereof and a device.

BACKGROUND

With the rapid development of a display technology, a display panel increasingly develops towards the higher integration and lower costs. A gate driving circuit of the TFT (Thin Film Transistor) is integrated on an array substrate of the display panel by using a GOA (Gate Driver on Array) technology to form scanning driving of the display panel. An existing gate driving circuit generally includes a plurality of cascaded shift units, each period of shift unit is correspondingly connected with a gate line and is configured to output a gate scanning signal to drive the connected gate line, thus resulting in a single function of the gate driving circuit, which is not beneficial to the improvement of the integration level.

SUMMARY

An embodiment of the disclosure provides a shift register. The shift register includes: a shift register sub-circuit and a touch control circuit, the touch control circuit is configured to be electrically connected with one touch electrode; wherein the shift register sub-circuit is configured to output a gate scanning signal and output a touch scanning signal to the touch control circuit; and the touch control circuit is electrically connected with the shift register sub-circuit and is configured to conduct the touch electrode with a touch detection signal terminal in response to the touch scanning signal.

Optionally, in the embodiment of the disclosure, the touch control circuit includes a first transistor; and a gate of the first transistor is configured to receive the touch scanning signal, a first electrode of the first transistor is electrically connected with the corresponding touch electrode, and a second electrode of the first transistor is electrically connected with the touch detection signal terminal.

Optionally, in the embodiment of the disclosure, the shift register further includes a touch reset circuit electrically connected with the touch electrode; and the touch reset circuit is configured to provide a common voltage signal to the touch electrode in response to a touch reset signal.

Optionally, in the embodiment of the disclosure, the touch reset circuit includes a second transistor; and a gate of the second transistor is configured to receive the touch reset signal, a first electrode of the second transistor is configured to receive the common voltage signal, and a second electrode of the second transistor is electrically connected with the corresponding touch electrode.

Optionally, in the embodiment of the disclosure, the shift register sub-circuit includes a scanning shift register circuit, a touch input reset circuit and a touch output circuit; the scanning shift register circuit is configured to output the gate scanning signal at least in response to a scanning input signal, a scanning reset signal, a signal of a pull-up node and a signal of a pull-down node; the touch input reset circuit is configured to provide a touch input signal to the pull-up node in response to the touch input signal, and provide a first reference signal to the pull-up node in response to the touch reset signal; and the touch output circuit is configured to provide a first clock signal to a touch output terminal in response to the signal of the pull-up node, and provide the first reference signal to the touch output terminal in response to the signal of the pull-down node, to output the touch scanning signal to the touch control circuit.

Optionally, in the embodiment of the disclosure, the touch input reset circuit includes a third transistor and a fourth transistor; a gate of the third transistor is electrically connected with a first electrode of the third transistor and is configured to receive the touch input signal, and a second electrode of the third transistor is electrically connected with the pull-up node; and a gate of the fourth transistor is configured to receive the touch reset signal, a first electrode of the fourth transistor is configured to receive the first reference signal, and a second electrode of the fourth transistor is electrically connected with the pull-up node.

Optionally, in the embodiment of the disclosure, the touch output circuit includes a fifth transistor, a sixth transistor and a first capacitor; a gate of the fifth transistor is electrically connected with the pull-up node, a first electrode of the fifth transistor is configured to receive the first clock signal, and a second electrode of the fifth transistor is electrically connected with the touch output terminal; a gate of the sixth transistor is electrically connected with the pull-down node, a first electrode of the sixth transistor is configured to receive the first reference signal, and a second electrode of the sixth transistor is electrically connected with the touch output terminal; and the first capacitor is connected between the pull-up node and the touch output terminal.

Optionally, in the embodiment of the disclosure, the scanning shift register circuit includes a scanning input reset circuit, a node control circuit and a scanning output circuit; the scanning input reset circuit is configured to provide the scanning input signal to the pull-up node in response to the scanning input signal, and provide the first reference signal to the pull-up node in response to the scanning reset signal; the node control circuit is configured to make levels of the pull-up node and the pull-down node opposite; and the scanning output circuit is configured to provide a second clock signal to a scanning output terminal in response to the signal of the pull-up node, and provide the first reference signal to the scanning output terminal in response to the signal of the pull-down node, to output the gate scanning signal.

Optionally, in the embodiment of the disclosure, the scanning input reset circuit includes a seventh transistor and an eighth transistor, wherein a gate and a first electrode of the seventh transistor are configured to receive the scanning input signal, and a second electrode of the seventh transistor is electrically connected with the pull-up node; and a gate of the eighth transistor is configured to receive the scanning reset signal, a first electrode of the eighth transistor is configured to receive the first reference signal, and a second electrode of the eighth transistor is electrically connected with the pull-up node; the scanning output circuit includes a ninth transistor, a tenth transistor and a second capacitor, wherein a gate of the ninth transistor is electrically connected with the pull-up node, a first electrode of the ninth transistor is configured to receive the second clock signal, and a second electrode of the ninth transistor is electrically connected with the scanning output terminal; a gate of the tenth transistor is electrically connected with the pull-down node, a first electrode of the tenth transistor is configured to receive the first reference signal, and a second electrode of the tenth transistor is electrically connected with the scanning output terminal; and the second capacitor is connected between the pull-up node and the scanning output terminal; and the node control circuit includes an eleventh transistor, a twelfth transistor, a thirteenth transistor, a fourteenth transistor and a fifteenth transistor, wherein a gate and a first electrode of the eleventh transistor are configured to receive a second reference signal, and a second electrode of the eleventh transistor is electrically connected with a gate of the twelfth transistor; a first electrode of the twelfth transistor is configured to receive the second reference signal, and a second electrode of the twelfth transistor is electrically connected with the pull-down node; a gate of the thirteenth transistor is electrically connected with the pull-up node, a first electrode of the thirteenth transistor is configured to receive the first reference signal, and a second electrode of the thirteenth transistor is electrically connected with the gate of the twelfth transistor; a gate of the fourteenth transistor is electrically connected with the pull-up node, a first electrode of the fourteenth transistor is configured to receive the first reference signal, and a second electrode of the fourteenth transistor is electrically connected with the pull-down node; and a gate of the fifteenth transistor is electrically connected with the pull-down node, a first electrode of the fifteenth transistor is configured to receive the first reference signal, and a second electrode of the fifteenth transistor is electrically connected with the pull-up node.

Accordingly, an embodiment of the disclosure further provides a driving method of the above shift register, including a display scanning period and a touch period; in the display scanning period, the shift register sub-circuit outputs the gate scanning signal; and in the touch period, the shift register sub-circuit outputs the touch scanning signal to the touch control circuit; and the touch control circuit conducts the touch electrode with the touch detection signal terminal in response to the touch scanning signal.

Accordingly, an embodiment of the disclosure further provides a gate driving circuit including a plurality of cascaded shift units; the shift units are divided into one or more unit groups; at least two shift units in at least one of the unit groups are the above shift registers, wherein a touch input signal of a first shift register in each of the unit groups is provided by one of touch triggering signals in one-to-one correspondence to the unit groups; and in every two adjacent shift registers in a same unit group, a touch input signal of the second shift register is provided by a touch scanning signal of the first shift register.

Optionally, in the embodiment of the disclosure, in the every two adjacent shift registers in the same unit group, a touch reset signal of the first shift register is provided by a touch scanning signal of the second shift register.

Optionally, in the embodiment of the disclosure, in the same unit group, the nonadjacent shift units are the above shift registers.

Optionally, in the embodiment of the disclosure, in the same unit group, each of the shift units is the above shift register.

Optionally, in the embodiment of the disclosure, in every four adjacent shift units, a scanning input signal of the fourth shift unit is provided by a gate scanning signal of the first shift unit, and a scanning reset signal of the first shift unit is provided by a gate scanning signal of the fourth shift unit.

Accordingly, an embodiment of the disclosure further provides an array substrate including a plurality of touch electrodes in a display region, and the above gate driving circuit and a touch detection line which are in a non-display region; the touch electrodes are electrically connected with the shift registers in the gate driving circuit in a one-to-one correspondence; and touch detection signal terminals of the shift registers are electrically connected with the touch detection line.

Optionally, in the embodiment of the disclosure, the display region further includes a plurality of gate lines, the number of the gate driving circuit is one, and the number of the touch detection line is one; and all the shift registers are located at the same ends of the gate lines.

Optionally, in the embodiment of the disclosure, the touch electrodes are self-capacitance electrodes; and the self-capacitance electrodes in one row are electrically connected with B adjacent shift registers respectively, wherein B represents a total number of the self-capacitance electrodes in one row.

Optionally, in the embodiment of the disclosure, the self-capacitance electrodes in each row are electrically connected with the B adjacent shift registers in sequence.

Optionally, in the embodiment of the disclosure, the number of the gate driving circuits is two; the number of the touch detection lines is two; and the first gate driving circuit in the two gate driving circuits is electrically connected with the first touch detection line in the two touch detection lines, and the second gate driving circuit is electrically connected with the second touch detection line in the two touch detection lines.

Optionally, in the embodiment of the disclosure, the display region further includes a plurality of gate lines, the first gate driving circuit is located at one end of the gate lines, and the second gate driving circuit is located at the other end of the gate lines.

Optionally, in the embodiment of the disclosure, the same touch electrode is electrically connected with one shift register in the first gate driving circuit and one shift register in the second gate driving circuit.

Optionally, in the embodiment of the disclosure, a part of the touch electrodes are electrically connected with the shift registers in the first gate driving circuit, and the other touch electrodes are electrically connected with the shift registers in the second gate driving circuit.

Optionally, in the embodiment of the disclosure, the touch electrodes are self-capacitance electrodes; and in the same row, a part of the self-capacitance electrodes are electrically connected with the shift register units in the first gate driving circuit, and the other self-capacitance electrodes are electrically connected with the shift register units in the second gate driving circuit.

Optionally, in the embodiment of the disclosure, in at least one row, an odd-numbered column of self-capacitance electrodes are electrically connected with the shift registers in the first gate driving circuit, and an even-numbered column of self-capacitance electrodes are electrically connected with the shift registers in the second gate driving circuit.

Accordingly, an embodiment of the disclosure further provides a display device including a driving chip and the above array substrate, wherein the driving chip is electrically connected with the touch detection line.

DETAILED DESCRIPTION

In order to make the objects, technical solutions and advantages of the disclosure clearer, the specific implementations of a shift register, a driving method thereof, a gate driving circuit, an array substrate and a display device according to embodiments of the disclosure are described below in detail in combination with accompanying drawings. It should be understood that preferred embodiments described below are merely intended to describe and explain the disclosure, rather than to limit the disclosure. In addition, the embodiments in the application and features in the embodiments can be combined with each other under the condition that no conflicts exist. It should be noted that the size and shape of each figure in the accompanying drawings do not reflect true proportions, but only aim at illustrating the content of the disclosure. Moreover, the same or similar symbols always represent for the same or similar elements or elements with the same or similar functions.

Figure 1:
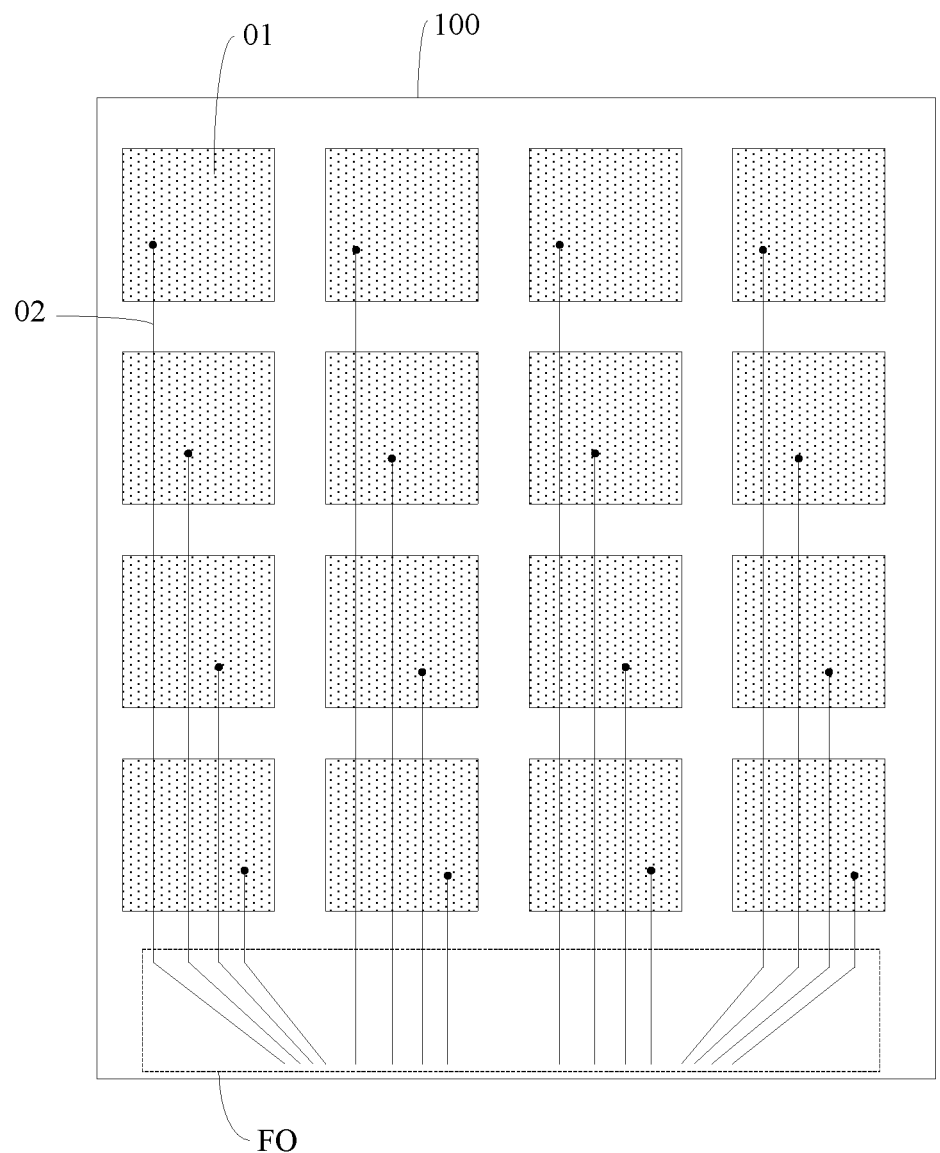
FIG. 1 is a schematic structural diagram of an array substrate in a related art.

With the rapid development of a display technology, an in cell touch panel has been gradually popularized in the life of people. As shown in FIG. 1, in the in cell touch panel, the touch electrodes 01 and touch detection lines 02 electrically connected with the touch electrodes 01 in a one-to-one correspondence are arranged on an array substrate 100, and embedded in a display panel, so that the overall thickness of a module and the production cost of a touch panel are reduced, and the touch panel is favored by major panel manufacturers. The touch detection lines 02 are required to be electrically connected with external driving IC(Integrated Circuit) by a wiring space in an FO(Fan-out) region, and each of the touch electrodes 01 respectively corresponds to one of the touch detection lines 02, so that the area of the FO region is relatively large. Therefore, in order to reduce the area of the FO region and the number of the touch detection lines 02, the touch detection lines 02 and the corresponding driving IC may be controlled to be turned on by a gate driving circuit. However, a general gate driving circuit is configured to output a gate scanning signal to gate lines. Therefore, how to design a structure of the gate driving circuit to integrate the scanning driving of the gate lines and the touch driving of the touch electrodes becomes a technical problem urgent to be solved by the skilled in the art.

Figure 2:
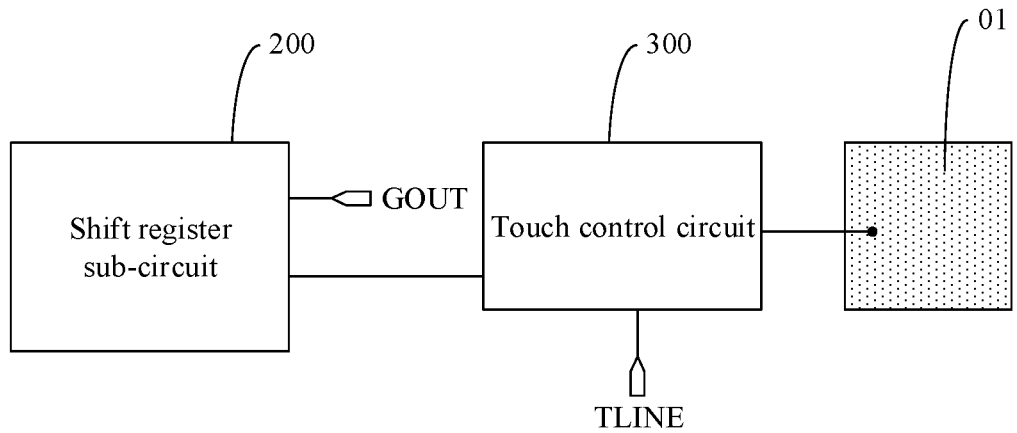
FIG. 2 is a first schematic structural diagram of a shift register in accordance with an embodiment of the disclosure.

Based on the above, the embodiment of the disclosure provides a shift register. As shown in FIG. 2, the shift register may include: a shift register sub-circuit 200 and a touch control circuit 300 configured to be electrically connected with one touch electrode 01. The shift register sub-circuit 200 is configured to output a gate scanning signal GOUT and output a touch scanning signal to the touch control circuit 300; and the touch control circuit 300 is electrically connected with the shift register sub-circuit 200 and is configured to connect the touch electrode 01 electrically connected with the touch control circuit 300 and a touch detection signal end TLINE in response to the touch scanning signal.

According to the above shift register according to the embodiment of the disclosure, the shift register sub-circuit may output the gate scanning signal, so that the gate lines may be driven. The shift register sub-circuit may output the touch scanning signal to the touch control circuit, so that the touch control circuit conducts the touch electrode electrically connected therewith with the touch detection signal terminal in response to the touch scanning signal, and thus the touch driving may be performed. Therefore, the shift register according to the embodiment of the disclosure is not only capable of realizing scanning driving, but also capable of realizing the touch driving of the touch electrodes, in addition, the preparation process may be simplified, and the production cost may be reduced.

The shift register according to the embodiment of the disclosure is described below in detail in combination with embodiments. It should be noted that the embodiment is intended to better explain the disclosure, rather than to limit the disclosure.

Figure 3:
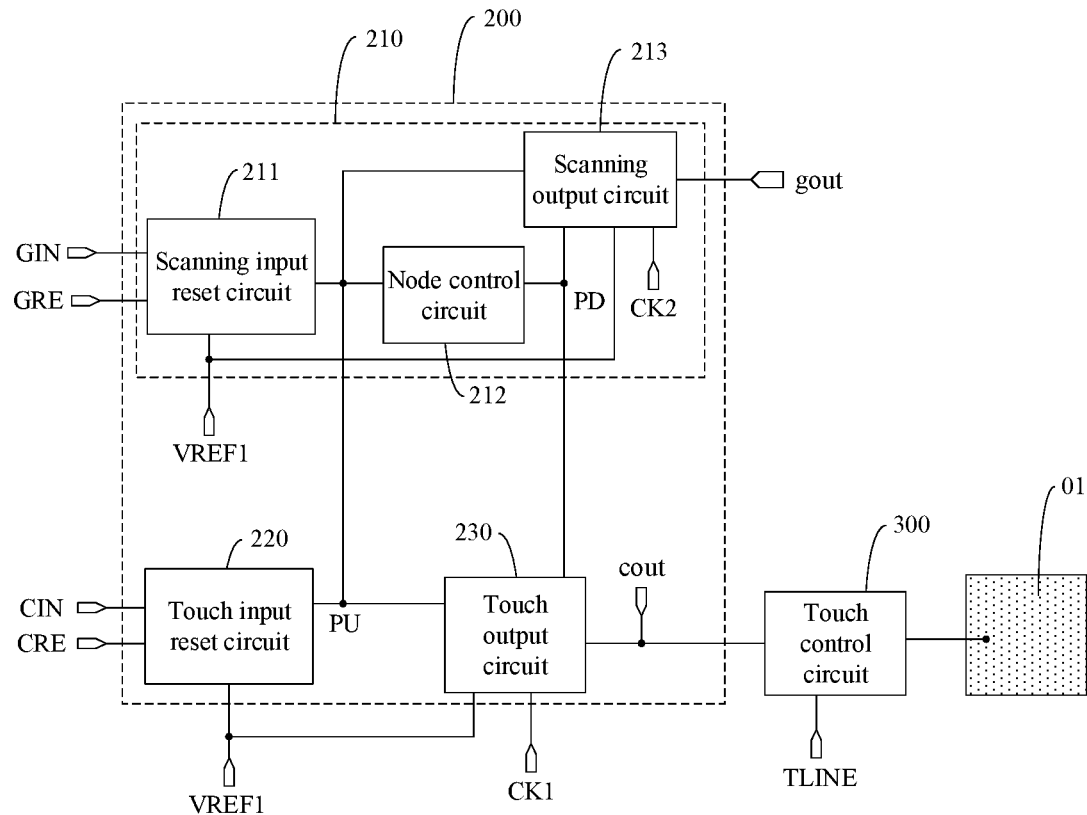
FIG. 3 is a second schematic structural diagram of a shift register in accordance with the embodiment of the disclosure.

For the shift register corresponding to some implementations of the disclosure, during specific implementation, in the embodiment of the disclosure, as shown in FIG. 3, the shift register sub-circuit 200 may include a scanning shift register circuit 210, a touch input reset circuit 220 and a touch output circuit 230.

The scanning shift register circuit 210 is configured to output the gate scanning signal GOUT at least in response to a scanning input signal GIN, a scanning reset signal GRE, a signal of a pull-up node PU and a signal of a pull-down node PD.

The touch input reset circuit 220 is configured to provide a touch input signal CIN to the pull-up node PU in response to the touch input signal CIN, and provide a first reference signal VREF1 to the pull-up node PU in response to a touch reset signal CRE.

The touch output circuit 230 is configured to provide a first clock signal CK1 to a touch output terminal cout in response to the signal of the pull-up node PU, and provide the first reference signal VREF1 to the touch output terminal cout in response to the signal of the pull-down node PD so as to output the touch scanning signal to the touch control circuit 300.

During implementation, in the embodiment of the disclosure, as shown in FIG. 3, the scanning shift register circuit 210 may include a scanning input reset circuit 211, a node control circuit 212 and a scanning output circuit 213.

The scanning input reset circuit 211 is configured to provide the scanning input signal GIN to the pull-up node PU in response to the scanning input signal GIN, and provide the first reference signal VREF1 to the pull-up node PU in response to the scanning reset signal GRE.

The node control circuit 212 is configured to make levels of the pull-up node PU and the pull-down node PD opposite.

The scanning output circuit 213 is configured to provide a second clock signal CK2 to a scanning output terminal gout in response to the signal of the pull-up node PD, and provide the first reference signal VREF1 to the scanning output terminal gout in response to the signal of the pull-down node PD so as to output the gate scanning signal.

Figure 4:
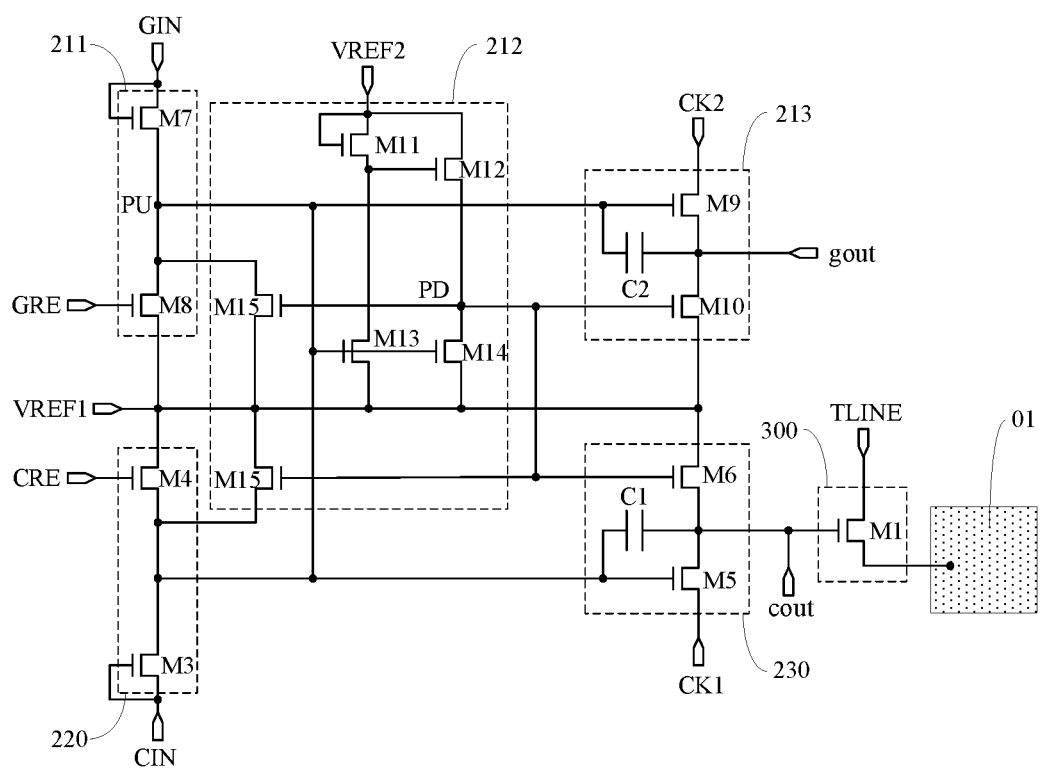
FIG. 4 is a first schematic circuit diagram of a shift register in accordance with the embodiment of the disclosure.

During implementation, in the embodiment of the disclosure, as shown in FIG. 4, the scanning input reset circuit 211 may include a seventh transistor M7 and an eighth transistor M8, wherein a gate and a first electrode of the seventh transistor M7 are configured to receive the scanning input signal GIN, and a second electrode of the seventh transistor M7 is electrically connected with the pull-up node PU. A gate of the eighth transistor M8 is configured to receive the scanning reset signal GRE, a first electrode of the eighth transistor M8 is configured to receive the first reference signal VREF1, and a second electrode of the eighth transistor M8 is electrically connected with the pull-up node PU.

During implementation, in the embodiment of the disclosure, when the seventh transistor M7 is turned on under the control of the scanning input signal GIN, the scanning input signal GIN may be provided to the pull-up node PU, to control the signal of the pull-up node PU. When the eighth transistor M8 is turned on under the control of the scanning reset signal GRE, the first reference signal VREF1 may be provided to the pull-up node PU to control the signal of the pull-up node PU.

During implementation, in the embodiment of the disclosure, as shown in FIG. 4, the scanning output circuit 213 may include a ninth transistor M9, a tenth transistor M10 and a second capacitor C2. A gate of the ninth transistor M9 is electrically connected with the pull-up node PU, a first electrode of the ninth transistor M9 is configured to receive the second clock signal CK2, and a second electrode of the ninth transistor M9 is electrically connected with the scanning output terminal gout. A gate of the tenth transistor M10 is electrically connected with the pull-down node PD, a first electrode of the tenth transistor M10 is configured to receive the first reference signal VREF1, and a second electrode of the tenth transistor M10 is electrically connected with the scanning output terminal gout. The second capacitor C2 is connected between the pull-up node PU and the scanning output terminal gout.

During implementation, in the embodiment of the disclosure, when the ninth transistor M9 is turned on under the control of the signal of the pull-up node PU, the second clock signal CK2 may be provided to the scanning output terminal gout, to control the level of the gate scanning signal output by the scanning output terminal gout. When the tenth transistor M10 is turned on under the control of the signal of the pull-down node PD, the first reference signal VREF1 may be provided to the scanning output terminal gout, to control the level of the gate scanning signal output by the scanning output terminal gout. The second capacitor C2 may store voltages input to the pull-up node PU and the scanning output terminal gout, and when the pull-up node PU is in a floating state, the second capacitor C2 can keep the stability of a voltage difference of the pull-up node PU and the scanning output terminal gout.

During implementation, in the embodiment of the disclosure, as shown in FIG. 4, the node control circuit 212 may include an eleventh transistor M11, a twelfth transistor M12, a thirteenth transistor M13, a fourteenth transistor M14 and a fifteenth transistor M15. A gate and a first electrode of the eleventh transistor M11 are configured to receive a second reference signal VREF2, and a second electrode of the eleventh transistor M11 is electrically connected with a gate of the twelfth transistor M12; a first electrode of the twelfth transistor M12 is configured to receive the second reference signal VREF2, and a second electrode of the twelfth transistor M12 is electrically connected with the pull-down node PD; a gate of the thirteenth transistor M13 is electrically connected with the pull-up node PU, a first electrode of the thirteenth transistor M13 is configured to receive the first reference signal VREF1, and a second electrode of the thirteenth transistor M13 is electrically connected with the gate of the twelfth transistor M12; a gate of the fourteenth transistor M14 is electrically connected with the pull-up node PU, a first electrode of the fourteenth transistor M14 is configured to receive the first reference signal VREF1, and a second electrode of the fourteenth transistor M14 is electrically connected with the pull-down node PD; and a gate of the fifteenth transistor M15 is electrically connected with the pull-down node PD, a first electrode of the fifteenth transistor M15 is configured to receive the first reference signal VREF1, and a second electrode of the fifteenth transistor M15 is electrically connected with the pull-up node PU.

During implementation, in the embodiment of the disclosure, when the eleventh transistor M1 is turned on under the control of the second reference signal VREF2, the second reference signal VREF2 may be provided to the gate of the twelfth transistor M12. When the thirteenth transistor M13 is turned on under the control of the signal of the pull-up node PU, the first reference signal VREF1 may be provided to gate of the twelfth transistor M12. When the twelfth transistor M12 is turned on under the control of a signal of the gate of the twelfth transistor M12, the second reference signal VREF2 may be provided to the pull-down node PD, to control the signal of the pull-down node PD. When the fourteenth transistor M14 is turned on under the control of the signal of the pull-up node PU, the first reference signal VREF1 may be provided to the pull-down node PD, to control the signal of the pull-down node PD. When the fifteenth transistor M15 is turned on under the control of the signal of the pull-down node PD, the first reference signal VREF1 may be provided to the pull-up node PU, to control the signal of the pull-up node PU.

Further, in order to ensure the stability of the signal of the pull-up node, during implementation, in the embodiment of the disclosure, two fifteenth transistors M15 may be arranged. Of course, in order to simplify the structure of the circuit and reduce the occupied space, only one fifteenth transistor M15 may also be arranged, there are no limits herein.

During implementation, the size of the fourteenth transistor is generally set to be greater than that of the twelfth transistor during preparation, due to the adoption of such a design, when the fourteenth transistor is turned on under the control of the signal of the pull-up node, the speed that the first reference signal is provided to the pull-down node may be greater than the speed that the second reference signal is provided to the pull-down node under the condition that the twelfth transistor is controlled by the signal of the gate of the twelfth transistor. For example, when the level of the signal of the pull-up node is a high level, the fourteenth transistor is turned on, then the size of the fourteenth transistor is set to be greater than that of the twelfth transistor, and thus the level of the pull-down node may be guaranteed to be a low level.

During implementation, in the embodiment of the disclosure, as shown in FIG. 4, the touch input reset circuit 220 may include a third transistor M3 and a fourth transistor M4. A gate of the third transistor M3 is electrically connected with a first electrode of the third transistor M3 and is configured to receive the touch input signal CIN, and a second electrode of the third transistor M3 is electrically connected with the pull-up node PU. A gate of the fourth transistor M4 is configured to receive the touch reset signal CRE, a first electrode of the fourth transistor M4 is configured to receive the first reference signal VREF1, and a second electrode of the fourth transistor M4 is electrically connected with the pull-up node PU.

During implementation, in the embodiment of the disclosure, when the third transistor M3 is turned on under the control of the touch input signal CIN, the touch input signal CIN may be provided to the pull-up node PU, to control the signal of the pull-up node PU. When the fourth transistor M4 is turned on under the control of the touch reset signal CRE, the first reference signal VREF1 may be provided to the pull-up node PU, to control the signal of the pull-up node PU.

During implementation, in the embodiment of the disclosure, as shown in FIG. 4, the touch output circuit 230 may include a fifth transistor M5, a sixth transistor M6 and a first capacitor C1. A gate of the fifth transistor M5 is electrically connected with the pull-up node PU, a first electrode of the fifth transistor M5 is configured to receive the first clock signal CK1, and a second electrode of the fifth transistor M5 is electrically connected with the touch output terminal cout. A gate of the sixth transistor M6 is electrically connected with the pull-down node PD, a first electrode of the sixth transistor M6 is configured to receive the first reference signal VREF1, and a second electrode of the sixth transistor M6 is electrically connected with the touch output terminal cout. The first capacitor C1 is connected between the pull-up node PU and the touch output terminal cout.

During implementation, in the embodiment of the disclosure, when the fifth transistor M5 is turned on under the control of the signal of the pull-up node PU, the first clock signal CK1 may be provided to the touch output terminal cout, to control the level of the touch scanning signal output by the touch output terminal cout. When the sixth transistor M6 is turned on under the control of the pull-down node PD, the first reference signal VREF1 may be provided to the touch output terminal cout, to control the level of the touch scanning signal output by the touch output terminal cout. The first capacitor C1 may store voltages input to the pull-up node PU and the touch output terminal cout. And when the pull-up node PU is in the floating state, the first capacitor can keep the stability of the voltage difference of the pull-up node PU and the scanning output terminal gout.

During implementation, in the embodiment of the disclosure, as shown in FIG. 4, the touch control circuit 300 may include a first transistor M1. A gate of the first transistor M1 is configured to receive the touch scanning signal, a first electrode of the first transistor M1 is electrically connected with the corresponding touch electrode 01, and a second electrode of the first transistor M1 is electrically connected with the touch detection signal terminal TLINE.

During implementation, in the embodiment of the disclosure, when the first transistor M1 is turned on under the control of the touch scanning signal, the corresponding touch electrode 01 may be conducted with the touch detection signal terminal TLINE, to conduct the touch electrode 01 with the IC, then the signal is transmitted, and a touch function is achieved.

A specific structure of each circuit in the shift register according to the embodiment of the disclosure is only illustrated, during implementation, the specific structure of each circuit is not limited to the above structure provided by the embodiment of the disclosure and may also be other structures known by the skilled in the art, there are no limits herein.

During implementation, an effective pulse signal of the scanning input signal may be a high-level signal, an effective pulse signal of the touch input signal may be a high-level signal, the first reference signal may be a low-level signal, and the second reference signal may be a high-level signal. Or, the effective pulse signal of the scanning input signal may be a low-level signal, the effective pulse signal of the touch input signal may be a low-level signal, the first reference signal may be a high-level signal, and the second reference signal may be a low-level signal.

During implementation, in order to reduce a preparation process, as shown in FIG. 4, all the transistors may be N-type transistors; or all the transistors may be P-type transistors, the disclosure will not be limited thereto.

Further, during implementation, the N-type transistor is turned on under the high-level signal and is turned off under the low-level signal; and the P-type transistor is turned off under the high-level signal and turned on under the low-level signal.

It should be noted that the transistors in the above embodiment of the disclosure may be TFTs (Thin Film Transistors) or MOS (Metal Oxide Semiconductor) field-effect transistors, the disclosure will not be limited thereto. During implementation, according to the types of the transistors and different input signals, the first electrodes of the above transistors may be source electrodes of the transistors and the second electrodes of the transistors may be drain electrodes of the transistors; or, the first electrodes of the transistors are the drain electrodes of the transistors, and the second electrodes of the transistors are the source electrodes of the transistors, no specific distinction is made herein.

Figure 5:
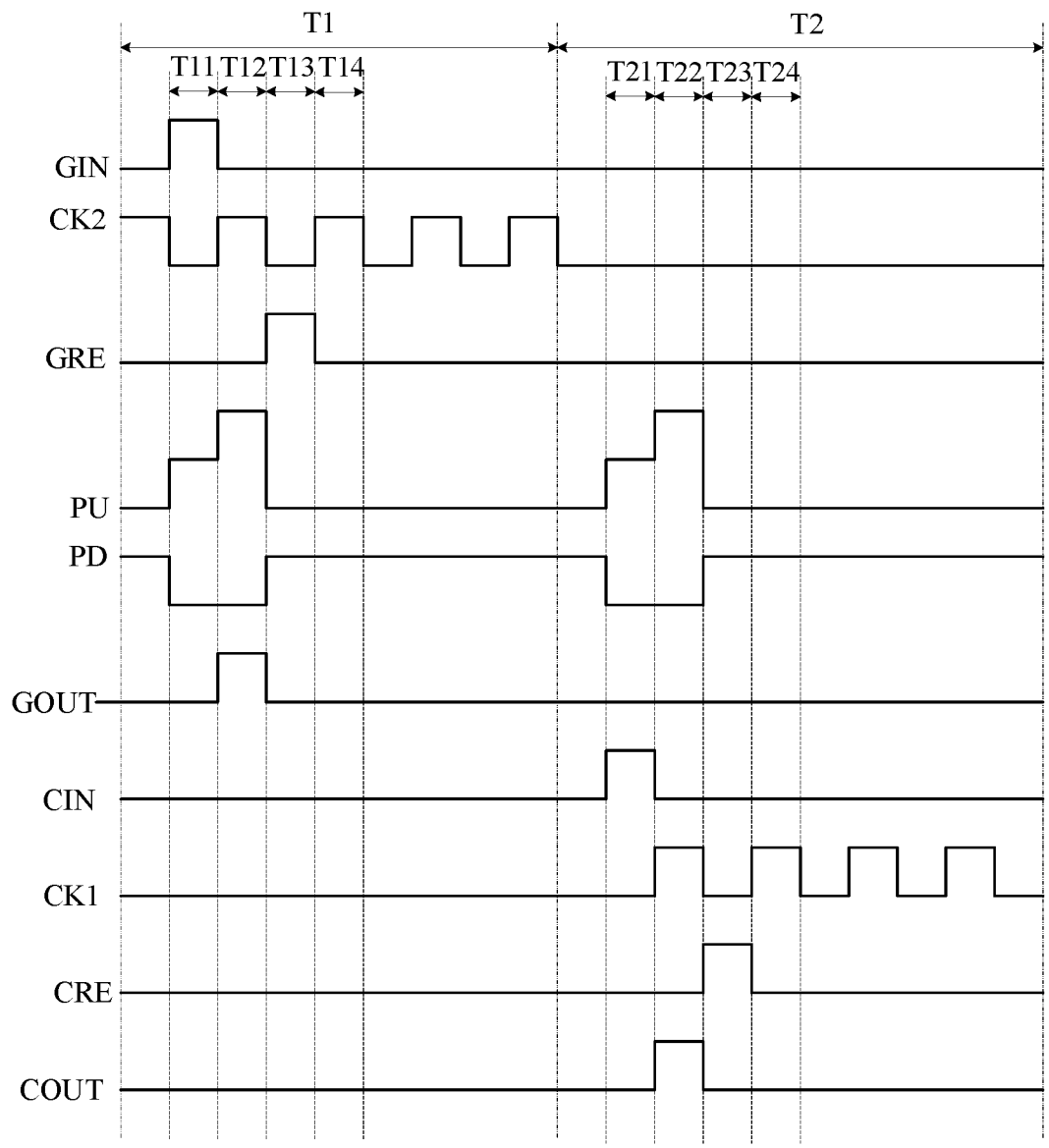
FIG. 5 is a first circuit timing diagram in accordance with an embodiment of the disclosure.

The operation process of the above shift register according to the embodiment of the disclosure is described below by taking a structure as shown in FIG. 4 as an example in combination with a circuit timing diagram as shown in FIG. 5. In the following description, 1 represents for a high-level signal, and 0 represents for a low-level signal, wherein 1 and 0 represent for logic levels of the high-level signal and the low-level signal and are merely intended to better explain the operation process of the above shift register according to the embodiment of the disclosure, rather than to explain a voltage value applied to the gate of each transistor during implementation.

As shown in FIG. 4, all the transistors are the N-type transistors, the first reference signal VREF1 being the low-level signal and the second reference signal VREF2 being the high-level signal are taken as examples. As shown in FIG. 5, one-frame display time may include a display scanning period T1 and a touch period T2, wherein the display scanning period T1 may include a scanning input period T11, a scanning output period T12 and a scanning reset period T13. The touch period T2 may include a touch input period T21, a touch output period T22 and a touch reset period T23. In the display scanning period T1, the first clock signal CK1 is a low-level signal, the second clock signal CK2 is a clock signal switched between the high-level signal and the low-level signal. In the touch period T2, the second clock signal CK2 is a low-level signal, and the first clock signal CK1 is a clock signal switched between the high-level signal and the low-level signal.

In the display scanning period T1, since CIN=0, CK1=0, and CRE=0, the third transistor M3 and the fourth transistor M4 are turned off all the time.

In the scanning input period T11, GIN=1, CK2=0, and GRE=0.

Since GRE=0, the eighth transistor M8 is turned off. Since GIN=1, the seventh transistor M7 is turned on, to provide the scanning input signal GIN being the high-level signal to the pull-up node PU, so that the signal of the pull-up node PU is a high-level signal, to control all the fifth transistor M5, the ninth transistor M9, the thirteenth transistor M13 and the fourteenth transistor M14 to be turned on. The turned-on fifth transistor M5 provides the low-level first lock signal CK1 to the touch output terminal cout, so that the low-level touch scanning signal COUT is output, and furthermore to control the first transistor M1 to be turned off. The turned-on thirteenth transistor M13 may provide the low-level first reference signal VREF1 to the twelfth transistor T12, to control the twelfth transistor T12 to be turned off. The turned-on fourteenth transistor M14 may provide the low-level first reference signal VREF1 to the pull-down node PD, so that the signal of the pull-down node PD is a low-level signal, to control all the sixth transistor M6, the tenth transistor M10 and the fifteenth transistor M15 to be turned off. The turned-on ninth transistor M9 may provide the low-level second clock signal CK2 to the scanning output terminal gout, to output the low-level gate scanning signal GOUT, and to control the first capacitor C1 to be charged.

In the scanning output period T12, GIN=0, CK2=1, and GRE=0.

Since GRE=0, the eighth transistor M8 is turned off. Since GIN=0, the seventh transistor M7 is turned off, and the pull-up node PU is in the floating state. Due to the effect of the second capacitor C2, the signal of the pull-up node PU may be kept as a high-level signal, to control all the fifth transistor M5, the ninth transistor M9, the thirteenth transistor M13 and the fourteenth transistor M14 to be turned on. The turned-on ninth transistor M9 may provide the high-level second clock signal CK2 to the scanning output terminal gout, to output the high-level gate scanning signal GOUT. Since the pull-up node PU is in the floating state, the level of the pull-up node PU may be further increased by a coupling effect of the second capacitor C2, to control the fifth transistor M5, the ninth transistor M9, the thirteenth transistor M13 and the fourteenth transistor M14 to be completely turned on as much as possible. The turned-on fifth transistor M5 provides the low-level first clock signal CK1 to the touch output terminal cout, to output the low-level touch scanning signal COUT, and furthermore to control the first transistor M1 to be turned off. The turned-on ninth transistor M9 may provide the high-level second clock signal CK2 to the scanning output terminal gout, to output the high-level gate scanning signal GOUT. The turned-on thirteenth transistor M13 may provide the low-level first reference signal VREF1 to the twelfth transistor T12, to control the twelfth transistor T12 to be turned off. The turned-on fourteenth transistor M14 may provide the low-level first reference signal VREF1 to the pull-down node PD, so that the signal of the pull-down node PD is a low-level signal, to control all the sixth transistor M6, the tenth transistor M10 and the fifteenth transistor M15 to be turned off.

In the scanning reset period T13, GIN=0, CK2=0, and GRE=1.

Since GIN=0, the seventh transistor M7 is turned off. Since GRE=1, the eighth transistor M8 is turned on, and the low-level first reference signal VREF1 is provided to the pull-up node PU, so that the signal of the pull-up node PU is a low-level signal, to control all the fifth transistor M5, the ninth transistor M9, the thirteenth transistor M13 and the fourteenth transistor M14 to be turned off. Since the eleventh transistor M11 provides the second reference signal VREF2 to the gate of the twelfth transistor T12 under the control of the high-level second reference signal VREF2, the twelfth transistor T12 is controlled to be turned on and the high-level second reference signal VREF2 is provided to the pull-down node PD, so that the signal of the pull-down node PD is a high-level signal, to control all the sixth transistor M6, the tenth transistor M10 and the fifteenth transistor M15 to be turned on. The turned-on fifteenth transistor T15 provides the low-level first reference signal VREF1 to the pull-up node PU, so that the signal of the pull-up node PU is further a low-level signal. The turned-on sixth transistor M6 provides the low-level first reference signal VREF1 to the touch output terminal cout, to output the low-level touch scanning signal COUT, and thus to control the first transistor M1 to be turned off. The turned-on tenth transistor M10 provides the low-level first reference signal VREF1 to the scanning output terminal gout, to output the low-level gate scanning signal GOUT.

After the scanning reset period T13, a scanning reset hold period T14 may also be included. In the scanning reset retaining period T14, GIN=0, CK2=0, and GRE=0. Since GIN=0, the seventh transistor M7 is turned off. Since GRE=0, the eighth transistor M8 is turned off. Since the eleventh transistor M11 provides the second reference signal VREF2 to the gate of the twelfth transistor M12 under the control of the high-level second reference signal VREF2, to control the twelfth transistor M12 to be turned on and provide the high-level second reference signal VREF2 to the pull-down node PD, so that the signal of the pull-down node PD is a high-level signal, and furthermore, all the sixth transistor M6, the tenth transistor M10 and the fifteenth transistor M15 are controlled to be turned on. The turned-on fifteenth transistor M15 provides the low-level first reference signal VREF1 to the pull-up node PU, so that the signal of the pull-up node PU is a low-level signal, and furthermore, all the fifth transistor M5, the ninth transistor M9, the thirteenth transistor M13 and the fourteenth transistor M14 are controlled to be turned off. The turned-on sixth transistor M6 provides the low-level first reference signal VREF1 to the touch output terminal cout, to output the low-level touch scanning signal COUT, and to control the first transistor M1 to be turned off. The turned-on tenth transistor M10 provides the low-level first reference signal VREF1 to the scanning output terminal gout, to output the low-level gate scanning signal GOUT.

After the scanning reset hold period T14, the operation process of the scanning reset hold period T14 is repeatedly executed all the time until the touch period T2 is reached.

In the touch period T2, since GIN=0, CK2=0, and GRE=0, the seventh transistor M7 and the eighth transistor M8 are turned off all the time.

In the touch input period T21, GIN=1, CK1=0, and CRE=0.

Since CRE=0, the fourth transistor M4 is turned off. Since CIN=1, the third transistor M3 is turned on to provide the high-level touch input signal CIN to the pull-up node PU, so that the signal of the pull-up node PU is the high-level signal, to control all the fifth transistor M5, the ninth transistor M9, the thirteenth transistor M13 and the fourteenth transistor M14 to be turned on. The turned-on fifth transistor M5 provides the low-level first lock signal CK1 to the touch output terminal cout, to output the low-level touch scanning signal COUT, and thus to control the first transistor M1 to be turned off, and the second capacitor C2 to be charged. The turned-on thirteenth transistor M13 may provide the low-level first reference signal VREF1 to the twelfth transistor M12, to control the twelfth transistor M12 to be turned off. The turned-on fourteenth transistor M14 may provide the low-level first reference signal VREF1 to the pull-down node PD, so that the signal of the pull-down node PD is the low-level signal, and to control all the sixth transistor M6, the tenth transistor M10 and the fifteenth transistor M15 to be turned off. The turned-on ninth transistor M9 may provide the low-level second clock signal CK2 to the scanning output terminal gout, to output the low-level gate scanning signal GOUT.

In the touch output period T22, CIN=0, CK1=1, and CRE=0.

Since CRE=0, the fourth transistor M4 is turned off. Since CIN=0, the third transistor M3 is turned off, and the pull-up node PU is in the floating state. Due to the effect of the first capacitor C1, the signal of the pull-up node PU may be kept as the high-level signal, to control all the fifth transistor M5, the ninth transistor M9, the thirteenth transistor M13 and the fourteenth transistor M14 to be turned on. The turned-on ninth transistor M5 may provide the high-level first clock signal CK1 to a reference output terminal cout, to output the high-level touch scanning signal COUT. Since the pull-up node PU is in the floating state, the level of the pull-up node PU may be further increased due to a coupling effect of the first capacitor C1, so that the fifth transistor M5, the ninth transistor M9, the thirteenth transistor M13 and the fourteenth transistor M14 are controlled to be completely turned on as much as possible. The turned-on ninth transistor M9 may provide the low-level second clock signal CK2 to the scanning output terminal gout, to output the low-level gate scanning signal GOUT. The turned-on thirteenth transistor M13 may provide the low-level first reference signal VREF1 to the twelfth transistor M12, to control the twelfth transistor M12 to be turned off. The turned-on fourteenth transistor M14 may provide the low-level first reference signal VREF1 to the pull-down node PD, so that the signal of the pull-down node PD is the low-level signal, to control all the sixth transistor M6, the tenth transistor M10 and the fifteenth transistor M15 to be turned off. The turned-on fifth transistor M5 provides the high-level first clock signal CK1 to the touch output terminal cout, to output the high-level touch scanning signal COUT, to control the first transistor M1 to be turned on. The turned-on first transistor M1 may connect the touch electrodes 01 and the touch detection signal end TLINE, so that the touch signal in the IC may be provided to the touch electrode 01, the signal on the touch electrode 01 may also be provided to the IC, and furthermore, touch recognition is performed through the IC.

In the touch reset period T23, CIN=0, CK1=0, and CRE=1.

Since CIN=0, the third transistor M3 is turned off. Since CRE=1, the fourth transistor M4 is turned on, and the low-level first reference signal VREF1 is provided to the pull-up node PU, so that the signal of the pull-up node PU is the low-level signal, to control all the fifth transistor M5, the ninth transistor M9, the thirteenth transistor M13 and the fourteenth transistor M14 to be turned off. Since the eleventh transistor M11 provides the second reference signal VREF2 to the gate of the twelfth transistor M12 under the control of the high-level second reference signal VREF2, to control the twelfth transistor M12 to be turned on and provide the high-level second reference signal VREF2 to the pull-down node PD, so that the signal of the pull-down node PD is the high-level signal, to control all the sixth transistor M6, the tenth transistor M10 and the fifteenth transistor M15 to be turned on. The turned-on fifteenth transistor M15 provides the low-level first reference signal VREF1 to the pull-up node PU, so that the signal of the pull-up node PU is further the low-level signal. The turned-on sixth transistor M6 provides the low-level first reference signal VREF1 to the touch output terminal cout, to output the low-level touch scanning signal COUT, and furthermore to control the first transistor M1 to be turned off. The turned-on tenth transistor M10 provides the low-level first reference signal VREF1 to the scanning output terminal gout, to output the low-level gate scanning signal GOUT.

After the touch reset period T23, a touch reset hold period T24 may also be included. At the touch reset hold period T24, CIN=0, CK1=0, and CRE=0. Since CIN=0, the third transistor M3 is turned off. Since CRE=0, the fourth transistor M4 is turned off. Since the eleventh transistor M11 provides the second reference signal VREF2 to the gate of the twelfth transistor M12 under the control of the high-level second reference signal VREF2, the twelfth transistor M12 is controlled to be turned on and the high-level second reference signal VREF2 is provided to the pull-down node PD, so that the signal of the pull-down node PD is the high-level signal, to control all the sixth transistor M6, the tenth transistor M10 and the fifteenth transistor M15 to be turned on. The turned-on fifteenth transistor M15 provides the low-level first reference signal VREF1 to the pull-up node PU, so that the signal of the pull-up node PU is the low-level signal, to control all the fifth transistor M5, the ninth transistor M9, the thirteenth transistor M13 and the fourteenth transistor M14 to be turned off. The turned-on sixth transistor M6 provides the low-level first reference signal VREF1 to the touch output terminal cout, to output the low-level touch scanning signal COUT, and furthermore to control the first transistor M1 to be turned off. The turned-on tenth transistor M10 provides the low-level first reference signal VREF1 to the scanning output terminal gout, to output the low-level gate scanning signal GOUT.

After the touch reset hold period T24, the operation process of the touch reset hold period T24 is repeatedly executed all the time until the next-frame display time is reached.

It should be noted that the sequence of the above display scanning period T1 and touch period T2 may be designed and determined according to an actual application environment, but is not limited herein.

Figure 6:
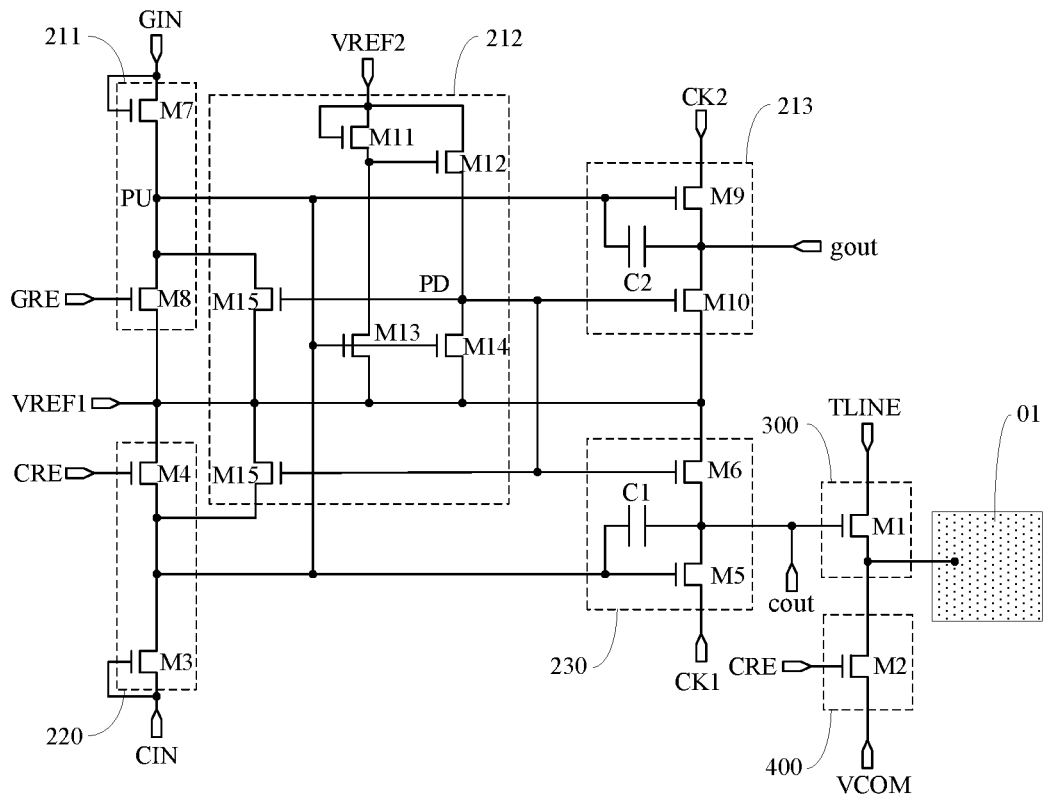
FIG. 6 is a second schematic circuit diagram of a shift register in accordance with an embodiment of the disclosure.

Schematic structural diagrams of shift registers corresponding to the other implementations of the disclosure are shown as FIG. 6 and are transformed with specific to the implementations of parts of structures in FIG. 4. The distinction of the this implementation and the implementation as shown in FIG. 4 is only described below, and the similarities thereof are omitted herein.

In order to reduce the thickness of the display panel, common electrodes in the display panel are generally patterned so as to form the plurality of touch electrodes which are independent from one another. Generally, common electrode signals may be loaded on the common electrodes when the display panel performs display. The touch signals may be loaded on the touch electrodes when the display panel performs touching. In order to ensure that the display panel performs normal display after completing touching, common voltage signals may be reloaded on the touch electrodes after touching is completed. During implementation, in the embodiment of the disclosure, as shown in FIG. 6, the shift register may further include a touch reset circuit 400 electrically connected with the touch electrode 01, wherein the touch reset circuit 400 is configured to provide the common voltage signal VCOM to the touch electrode 01 in response to the touch reset signal CRE.

During implementation, in the embodiment of the disclosure, as shown in FIG. 6, the touch reset circuit 400 may include a second transistor M2. A gate of the second transistor M2 is configured to receive the touch reset signal CRE, a first electrode of the second transistor M2 is configured to receive the common voltage signal VCOM, and a second electrode of the second transistor M2 is electrically connected with the corresponding touch electrode 01. When the second transistor M2 is turned on under the control of the touch reset signal CRE, to provide the common voltage signal VCOM to the touch electrode 01.

The operation process of the above shift register according to the embodiment of the disclosure is described below by taking a structure as shown in FIG. 6 as an example in combination with the circuit timing diagram as shown in FIG. 5. It only describes the difference of the present implementation and the implementation of the operation process of the structure as shown in FIG. 4, and the other operation processes are omitted herein.

In the display scanning period T1, since CRE=0, the second transistor M2 is turned off all the time.

In the touch input period T21, since CRE=0, the second transistor M2 is also turned off.

In the touch output period T22, since CRE=0, the second transistor M2 is also turned off.

In the touch reset period T23, since CRE=1, the second transistor M2 is also turned on to provide the common voltage signal VCOM to the touch electrode 01, so that normal display may be guaranteed.

Figure 7:
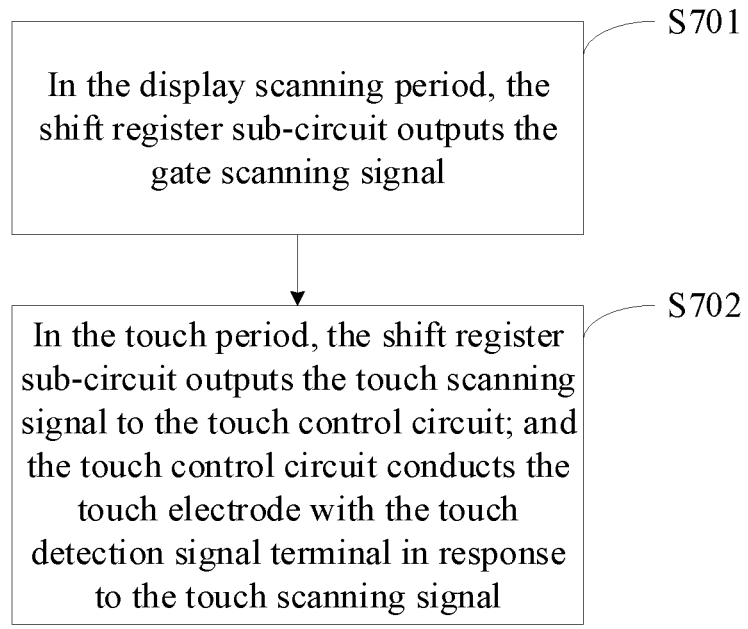
FIG. 7 is a flow diagram of a driving method in accordance with an embodiment of the disclosure.

Based on the same concept, the embodiment of the disclosure further provides the driving method of the above shift register. As shown in FIG. 7, the driving method may include a display scanning period and a touch period; the method includes the following steps.

S701, in the display scanning period, the shift register sub-circuit outputs the gate scanning signal.

S702, in the touch period, the shift register sub-circuit outputs the touch scanning signal to the touch control circuit; and the touch control circuit connects the touch electrode and the touch detection signal terminal in response to the touch scanning signal.

During implementation, each-frame display time may include the display scanning period and the touch period. Or one-frame display time spaced by at least one-frame display time may include the display scanning period and the touch period. For example, the one-frame display time spaced by one-frame display time may include the display scanning period and the touch period, and other-frame display time includes the display scanning period. That is, odd-frame display time includes the display scanning period and the touch period, and even-frame display time includes the display scanning period, the disclosure will not be limited thereto. Or one-frame display time spaced by five-frame display time includes the display scanning period and the touch period, namely the first-frame display time and the seventh-frame display time include the display scanning period and the touch period, and the second-frame display time to the sixth-frame display time include the display scanning time, the disclosure will not be limited thereto. In addition, the numbers of the display scanning period and touch period included in the one-frame display time may be designed and determined according to the actual application environment, there are no limits herein, wherein the operation processes of the display scanning period and the touch period may refer to the embodiment of the above shift register, the descriptions thereof are omitted herein.

It should be noted that the above step S701 may be performed before or after the step S702 within the one-frame display time, there are no limits herein.

During implementation, the display scanning period may include a scanning input period, a scanning output period and a scanning reset period.

In the scanning input period, a scanning input reset circuit provides a scanning input signal to the pull-up node in response to the scanning input signal; the node control circuit makes the levels of the pull-up node and the pull-down node opposite; and the scanning output circuit provides the second clock signal to the scanning output terminal in response to the signal of the pull-up node. The touch output circuit provides the first clock signal to the touch output terminal in response to the signal of the pull-up node.

In the scanning output period, the node control circuit makes the levels of the pull-up node and the pull-down node opposite; the scanning output circuit provides the second clock signal to the scanning output terminal in response to the signal of the pull-up node. The touch output circuit provides the first clock signal to the touch output terminal in response to the signal of the pull-up node.

In the scanning reset period, the scanning input reset circuit provides the first reference signal to the pull-up node in response to the scanning reset signal; the node control circuit makes the levels of the pull-up node and the pull-down node opposite; and the scanning output circuit provides the first reference signal to the scanning output terminal in response to the signal of the pull-down node. The touch output circuit provides the first reference signal to the touch output terminal in response to the signal of the pull-down node.

During implementation, the touch period may include a touch input period, a touch output period and a touch reset period.

In the touch input period, the touch input reset circuit provides the touch input signal to the pull-up node in response to the touch input signal; the node control circuit is configured to make the levels of the pull-up node and the pull-down node opposite; and the touch output circuit provides the first clock signal to the touch output terminal in response to the signal of the pull-up node. The scanning output circuit provides the second clock signal to the scanning output terminal in response to the signal of the pull-up node.

In the touch output period, the node control circuit is configured to make the levels of the pull-up node and the pull-down node opposite; the touch output circuit provides the first clock signal to the touch output terminal in response to the signal of the pull-up node. The scanning output circuit provides the second clock signal to the scanning output terminal in response to the signal of the pull-up node.

In the touch reset period, the touch input reset circuit provides the first reference signal to the pull-up node in response to the touch reset signal; the node control circuit makes the levels of the pull-up node and the pull-down node opposite; and the touch output circuit provides the first reference signal to the touch output terminal in response to the signal of the pull-down node. The scanning output circuit provides the first reference signal to the scanning output terminal in response to the signal of the pull-down node.

The driving principle and implementation of the driving method of the shift register are same as those in the embodiment of the above shift register, and therefore, the driving method of the shift register may be executed by reference to the implementation of the shift register in the above embodiment, the descriptions thereof are omitted herein.

Figure 8:
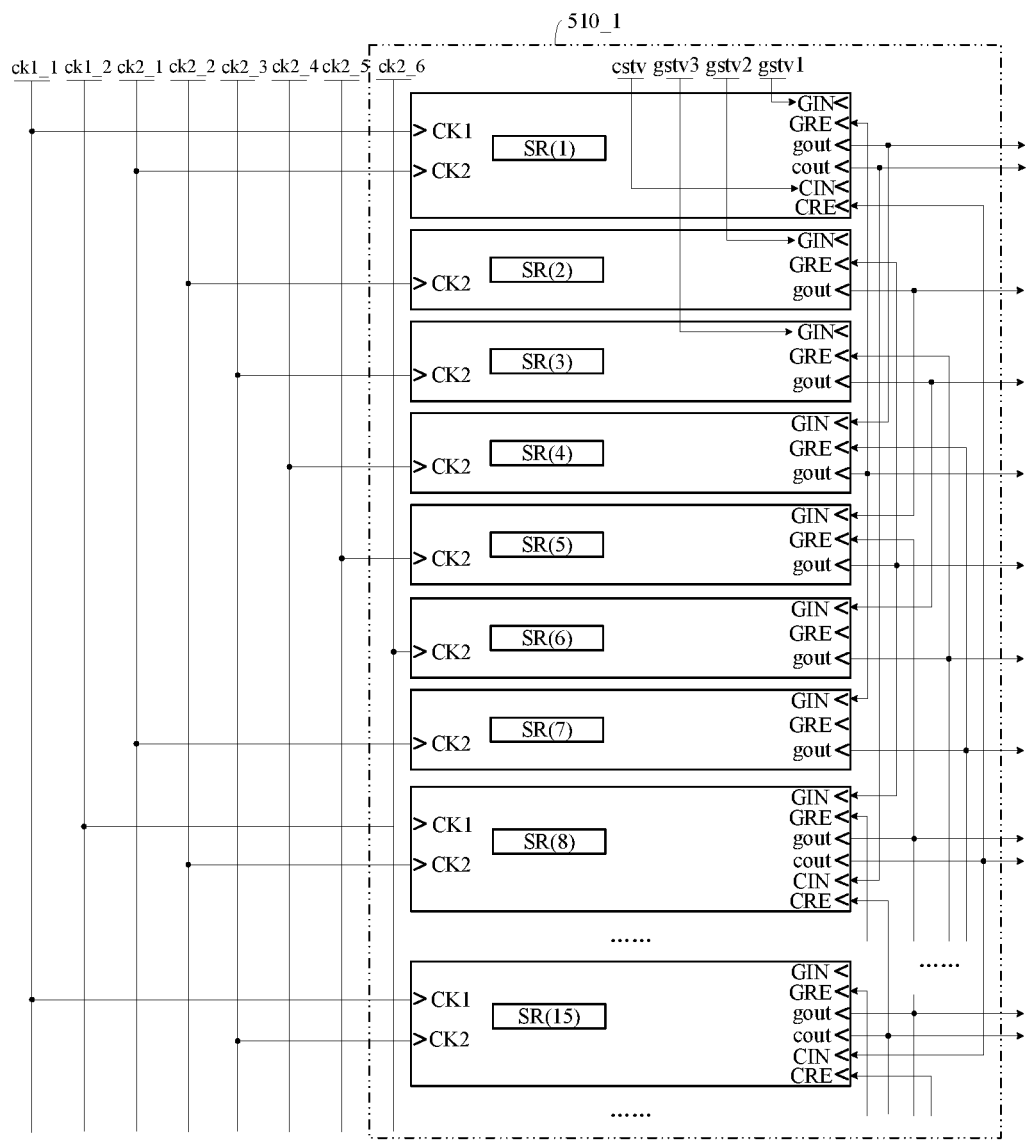
FIG. 8 is a first schematic structural diagram of a gate driving circuit in accordance with an embodiment of the disclosure.

Based on the same concept, the embodiment of the disclosure further provides the gate driving circuit, as shown in FIG. 8, including a plurality of cascaded shift units SR(1), SR(2), SR(3) . . . SR(n−1), SR(n) . . . SR(N−2), SR(N−1) and SR(N) (there are N shift units in total, n is an integer larger than or equal to 1 and smaller than or equal to N, for example, N=15 in FIG. 8). The value of N may be designed and determined according to the actual application environment, but is not limited herein.

During implementation, as shown in FIG. 8, the shift units are divided into at least one unit group 510_*m* (m is an integer larger than or equal to 1 and smaller than or equal to M, M is a total number of the unit groups, for example, M=1 in FIG. 8); and at least two shift units in at least one unit group are the above shift registers according to the embodiment of the disclosure. A touch input signal of the first shift register in each unit group is provided by a touch triggering signal in one-to-one correspondence. And in every two adjacent shift registers in the same unit group, a touch input signal of the second shift register is provided by a touch scanning signal of the first shift register. In this way, the gate driving circuit is not only capable of realizing scanning driving, but also capable of realizing the touch driving of the touch electrode, in addition, the preparation process may be simplified, and the production cost may be reduced.

During implementation, the number of the shifting registers provided by the embodiment of the disclosure and adopted as the shifting units may be determined according to the number of the touch electrodes in actual application, but is not limited herein. The structure and operation principle of the shift registers may refer to the above embodiment, and the descriptions thereof are omitted herein. In addition, it should be noted that the above shift units refer to the shift registers provided by the embodiment of the disclosure, and the shift units operating by adopting the structure of any one of the shift registers provided by the embodiment of the disclosure. The structures of the shift units except the shift units adopting the shift registers provided by the embodiment of the disclosure may be the structure of the above scanning shift register circuit provided by the embodiment of the disclosure. In addition, the scanning shift register circuit may realize the operation process of the display scanning period, which specifically refers to the above embodiment, and the descriptions thereof are omitted herein.

It should be noted that the first shift register in each unit group refers to the shift unit, firstly adopting the structure of the shift register provided by the embodiment of the disclosure, in each unit group. For example, as shown in FIG. 8, the shift unit SR(1) in the unit group 510_1 is the shift unit firstly adopting the structure of the shift register provided by the embodiment of the disclosure, and therefore, the shift unit SR(1) is the first shift register in the unit group 510_1.

The gate driving circuit provided by the disclosure is described below in detail in combination with specific embodiments. It should be noted that the present embodiment is intended to better explain the disclosure, rather than to limit the disclosure.

Schematic structural diagrams of the gate driving circuits corresponding to some implementations of the disclosure are shown as FIG. 8, M may be set to be 1, that is, all the shift units are used as one unit group 510_1. During implementation, in the embodiment of the disclosure, in every four adjacent shift units, a scanning input signal of the fourth shift unit is provided by a gate scanning signal of the first shift unit, and a scanning reset signal of the first shift unit is provided by a gate scanning signal of the fourth shift unit. For example, in the shift units SR(1)-SR(4), a scanning input signal GIN of the fourth shift unit SR(4) is provided by a gate scanning signal of a scanning output terminal gout of the first shift unit SR(1), and a scanning reset signal GRE of the first shift unit SR(1) is provided by a gate scanning signal of a scanning output terminal gout of the fourth shift unit SR(4). The rest may be done in the same manner, and the descriptions thereof are omitted herein. In addition, a scanning input signal GIN of the first shift unit SR(1) is provided by a first frame triggering signal gstv1, a scanning input signal GIN of the second shift unit SR(2) is provided by a second frame triggering signal gstv2, and a scanning input signal GIN of the third shift unit SR(3) is provided by a third frame triggering signal gstv3.

During implementation, in the embodiment of the disclosure, as shown in FIG. 8, in every two adjacent shift registers in the same unit group, a touch reset signal of the first shift register is provided by a touch scanning signal of the second shift register.

During implementation, in the embodiment of the disclosure, as shown in FIG. 8, in the same unit group, the non-adjacent shift registers may be the above shift registers provided by the embodiment of the disclosure. Specifically, in the same unit group, the number of the shift units spaced among the shift units which adopt the above shift registers provided by the embodiment of the disclosure may be same. For example, as shown in FIG. 8, six shift units may be spaced among the shift units adopting the structures of the above shift registers provided by the embodiment of the disclosure in the same unit group. That is, the shift unit SR(1) adopts the structure of the above shift register provided by the embodiment of the disclosure, a shift unit SR(8) adopts the structure of the above shift register provided by the embodiment of the disclosure, a shift unit SR(15) adopts the structure of the above shift register provided by the embodiment of the disclosure, and the rest may be done in the same manner, the descriptions thereof are omitted herein. The other shift units SR(2)-SR(7) may adopt the structures of the above scanning shift register circuits provided by the embodiment of the disclosure.

Of course, in the same unit group, the number of the shift units spaced among the shift units adopting the structures of the above shift registers provided by the embodiment of the disclosure may also be different. For example, the shift unit SR(1) adopts the structure of the above shift register provided by the embodiment of the disclosure, a shift unit SR(10) adopts the structure of the above shift register provided by the embodiment of the disclosure, the shift unit SR(15) adopts the structure of the above shift register provided by the embodiment of the disclosure, and the rest may be done in the same manner, the descriptions thereof are omitted herein.

During implementation, in the embodiment of the disclosure, as shown in FIG. 8, a second clock signal CK2 of a (6x-5)-th-stage shift unit is provided by a same clock terminal ck2_1, a second clock signal CK2 of a (6x-4)-th-stage shift unit is provided by the same clock terminal ck2_2, a second clock signal CK2 of a (6x-3)-th-stage shift unit is provided by the same clock terminal ck2_3, a second clock signal CK2 of a (6x-2)-th-stage shift unit is provided by the same clock terminal ck2_4, a second clock signal CK2 of a (6x-1)-th-stage shift unit is provided by the same clock terminal ck2_5, and a second clock signal CK2 of a (6x)-th-stage shift unit is provided by the same clock terminal ck2_6, wherein x is a positive integer.

During implementation, in the embodiment of the disclosure, as shown in FIG. 8, a first clock signal CK1 of the odd shift register is provided by the same clock terminal ck1_1, and a first clock signal CK1 of an even shift register is provided by the same clock terminal ck1_2. For example, first clock signals CK1 of the shift units SR(1)-SR(15) adopting the shift registers provided by the embodiment of the disclosure are provided by the same clock terminal ck1_1, and a first clock signal CK1 of the shift unit SR(8) adopting the shift register provided by the embodiment of the disclosure is provided by the same clock terminal ck1_2.

Figure 9:
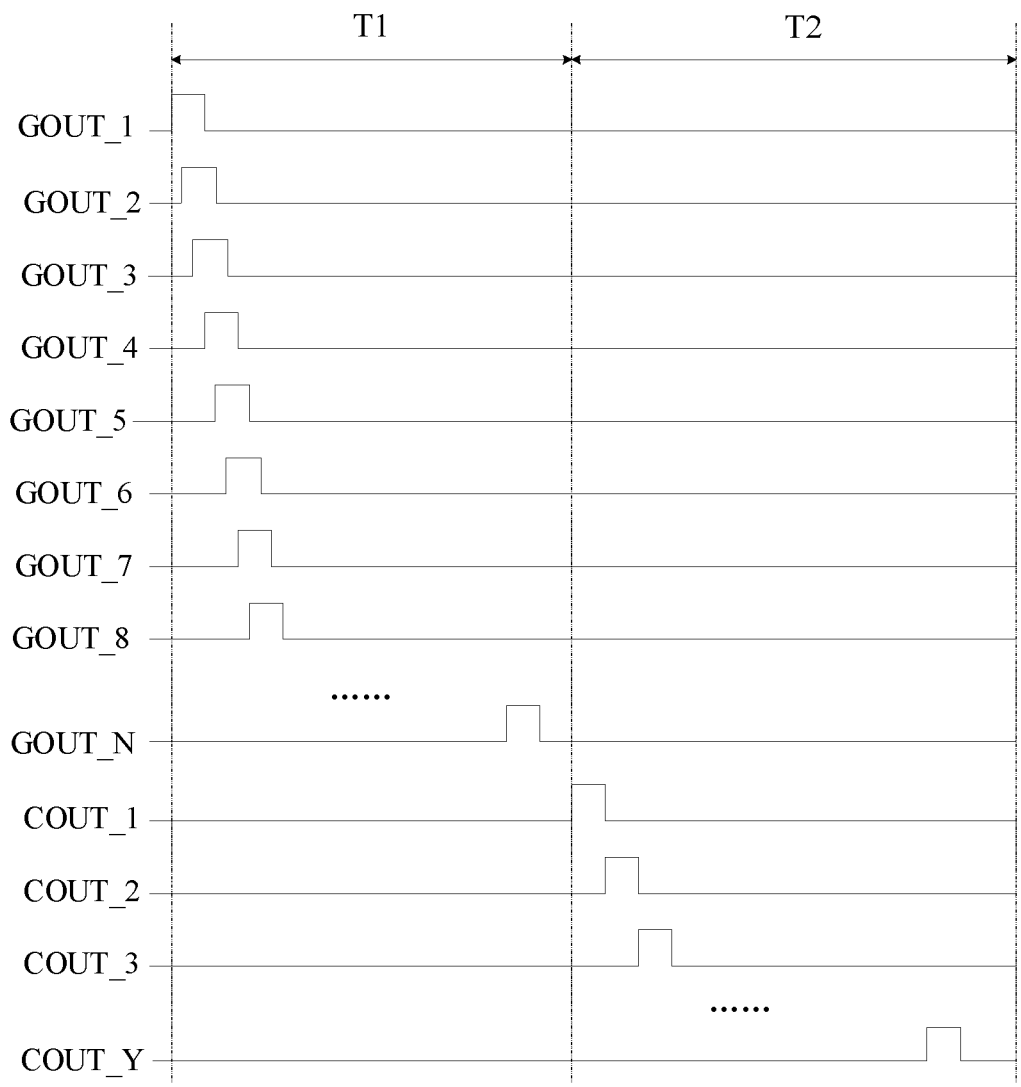
FIG. 9 is a second circuit timing diagram in accordance with an embodiment of the disclosure.

The operation process of the above gate driving circuit provided by the embodiment of the disclosure is described below by taking the structure as shown in FIG. 8 as an example in combination with a circuit timing diagram as shown in FIG. 9. Y number of shift units adopting the shift registers provided by the embodiment of the disclosure are taken as examples to be described below.

As shown in combination with FIG. 8 and FIG. 9, in the unit group 510_1, a touch input signal of the shift register of the first shift unit SR(1) is provided by a touch triggering signal cstv. A touch reset signal CRE of the shift register of the first shift unit SR(1) is provided by a touch scanning signal of a touch output terminal cout of the shift register of the eighth shift unit SR(8). A touch input signal CIN of the shift register of the eighth shift unit SR(8) is provided by a touch scanning signal of a touch output terminal cout of the shift register of the first shift unit SR(1). A touch reset signal CRE of the shift register of the eighth shift unit SR(8) is provided by a touch scanning signal of a touch output terminal cout of the shift register of the fifteenth shift unit SR(15). A touch input signal CIN of the shift register of the fifteenth shift unit SR(15) is provided by a touch scanning signal of a touch output terminal cout of the shift register of the eighth shift unit SR(8). The rest may be done in the same manner, and the descriptions thereof are omitted herein.

The scanning input signal GIN of the first shift unit SR(1) is provided by the first frame triggering signal gstv1, the scanning input signal GIN of the fourth shift unit SR(4) is provided by the gate scanning signal of the scanning output terminal gout of the first shift unit SR(1), the scanning reset signal GRE of the first shift unit SR(1) is provided by the gate scanning signal of the scanning output terminal gout of the fourth shift unit SR(4), and the rest may be done in the same manner.

The scanning input signal GIN of the second shift unit SR(2) is provided by the second frame triggering signal gstv2, a scanning input signal GIN of the fifth shift unit SR(5) is provided by the gate scanning signal of the scanning output terminal gout of the second shift unit SR(2), the scanning reset signal GRE of the second shift unit SR(2) is provided by a gate scanning signal of a scanning output terminal gout of the fifth shift unit SR(5), and the rest may be done in the same manner.

The scanning input signal GIN of the third shift unit SR(3) is provided by the third frame triggering signal gstv3. A scanning input signal GIN of the sixth shift unit SR(6) is provided by a gate scanning signal of a scanning output terminal gout of the third shift unit SR(3), a scanning reset signal GRE of the third shift unit SR(3) is provided by a gate scanning signal of a scanning output terminal gout of the sixth shift unit SR(6), and the rest may be done in the same manner.

GOUT_1-GOUT_N respectively represent the gate scanning signals output by the scanning output terminals gout of the first shift unit SR(1) to the N-th shift unit SR(N). COUT_1-COUT_Y respectively represent the touch scanning signals output by the touch output terminals cout of the first shift register to the Y-th shift register. The first shift register to the Y-th shift register refer to the first shift unit to the Y-th shift unit among the shift units adopting the shift registers provided by the embodiment of the disclosure, for example, the first shift unit SR(1) is the first shift register, the eighth shift unit SR(8) is the second shift register, the fifteenth shift unit SR(15) is the third shift register, and the rest may be done in the same manner, the descriptions thereof are omitted herein.

One-frame display time may include a display scanning period T1 and a touch period T2. In the display scanning period T1, the gate driving circuit may output the gate scanning signals GOUT_1-GOUT_N. In the touch period T2, the gate driving circuit may output the touch scanning signals COUT_1-COUT_Y, to control the first transistors M1 in the first shift register to the Y-th shift register to be sequentially turned on to perform touch driving. In this way, the process of the touch period may be performed after the process of the display scanning period is completed.

Figure 10:
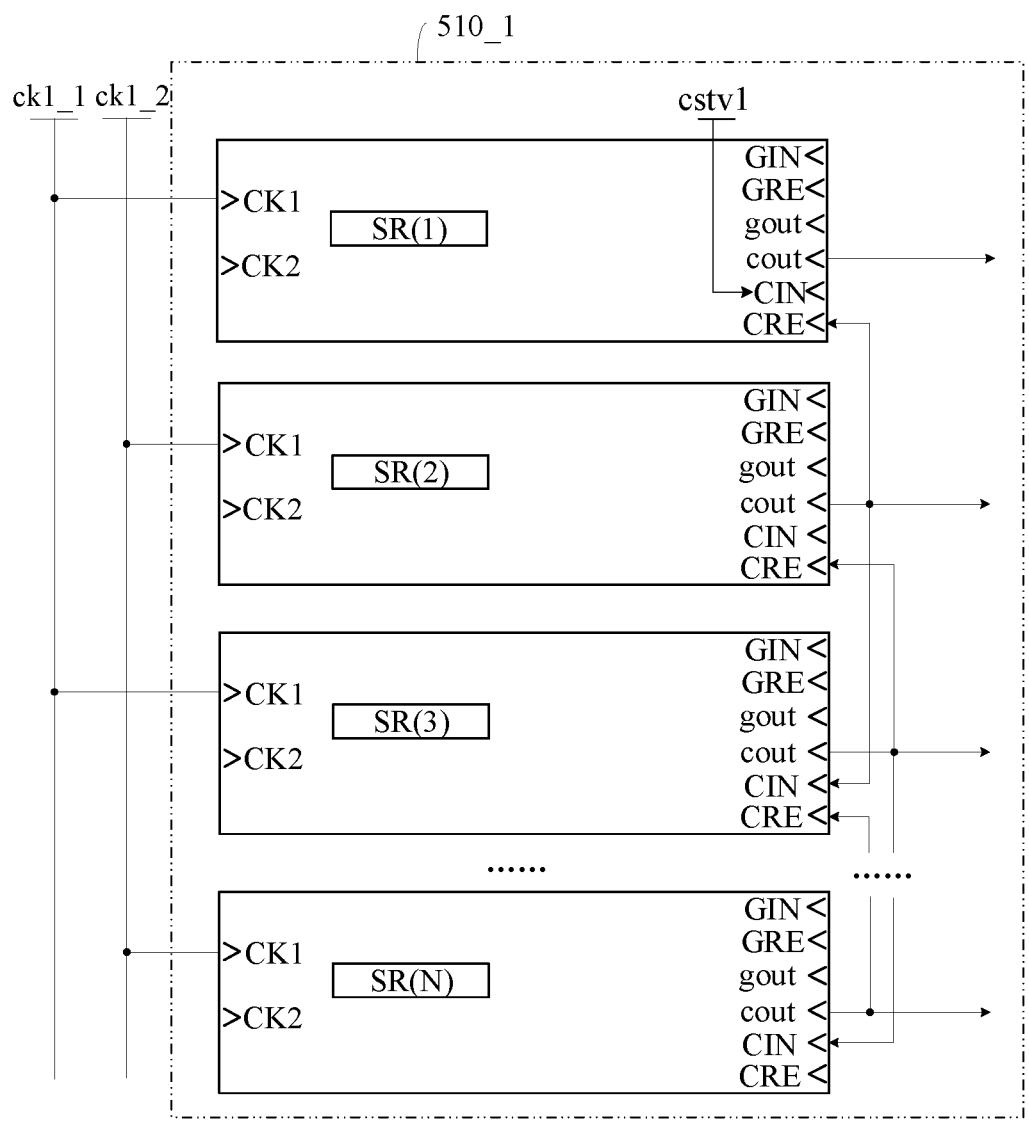
FIG. 10 is a second schematic structural diagram of a gate driving circuit in accordance with an embodiment of the disclosure.

Schematic structural diagrams of gate driving circuits corresponding to other implementations of the disclosure are shown as FIG. 10 and are transformed with specific to the implementations of parts of structures in FIG. 8. It only describes the difference of the present implementation and the implementation as shown in FIG. 8 below, and the similarities thereof are omitted herein.

During implementation, in the embodiment of the disclosure, as shown in FIG. 10, in the same unit group, each shift unit is the above shift register provided by the embodiment of the disclosure. The cascade relation of electrical connection among the first clock signal, the scanning input signals, the scanning reset signals and the scanning output terminal may refer to the embodiment corresponding to FIG. 8, and the cascade relation of electrical connection among the second clock signal, the touch output terminals, the touch input signals and the touch reset signals is only described below.

As shown in FIG. 10, in the unit group 510_1, each of the shift units SR(1)-SR(N) may be set to be of the structure of the above shift registers provided by the embodiment of the disclosure. Specifically, the first clock signal CK1 of the odd shift register is provided by the same clock terminal ck1_1, and the first clock signal CK1 of the even shift register is provided by the same clock terminal ck1_2. The touch input signal CIN of the first shift unit SR(1) is provided by the touch triggering signal cstv1. The touch reset signal CRE of the first shift unit SR(1) is provided by the touch scanning signal of the touch output terminal cout of the second shift unit SR(2). The touch input signal CIN of the second shift unit SR(2) is provided by the touch scanning signal of the touch output terminal cout of the first shift unit SR(1). The touch reset signal CRE of the second shift unit SR(2) is provided by the touch scanning signal of the touch output terminal cout of the third shift unit SR(3). The rest may be done in the same manner, the descriptions thereof are omitted herein.

The operation process of the above gate driving circuit provided by the embodiment of the disclosure is described below by taking a structure as shown in FIG. 10 as an example in combination with the circuit timing diagram as shown in FIG. 9.

GOUT_1-GOUT_N respectively represent the gate scanning signals output by the scanning output terminals gout of the first shift unit SR(1) to the N-th shift unit SR(N). Y=N, COUT_1-COUT_Y respectively represent the touch scanning signals output by the touch output terminals cout of the first shift unit SR(1) to the N-th shift unit SR(N), wherein the first shift unit SR(1) is the first shift register, the second shift unit SR(2) is the second shift register, the third shift unit SR(3) is the third shift register, and the rest may be done in the same manner, the descriptions thereof are omitted herein.

One-frame display time may include a display scanning period T1 and a touch period T2. In the display scanning period T1, the gate driving circuit may output the gate scanning signals GOUT_1-GOUT_N. In the touch period T2, the gate driving circuit may output the touch scanning signals COUT_1-COUT_Y, to control the first transistors M1 in the first shift unit SR(1) to the N-th shift unit SR(N) to be sequentially turned on to perform touch driving. In this way, the process of the touch period may be performed after the process of the display scanning period is completed.

Figure 11:
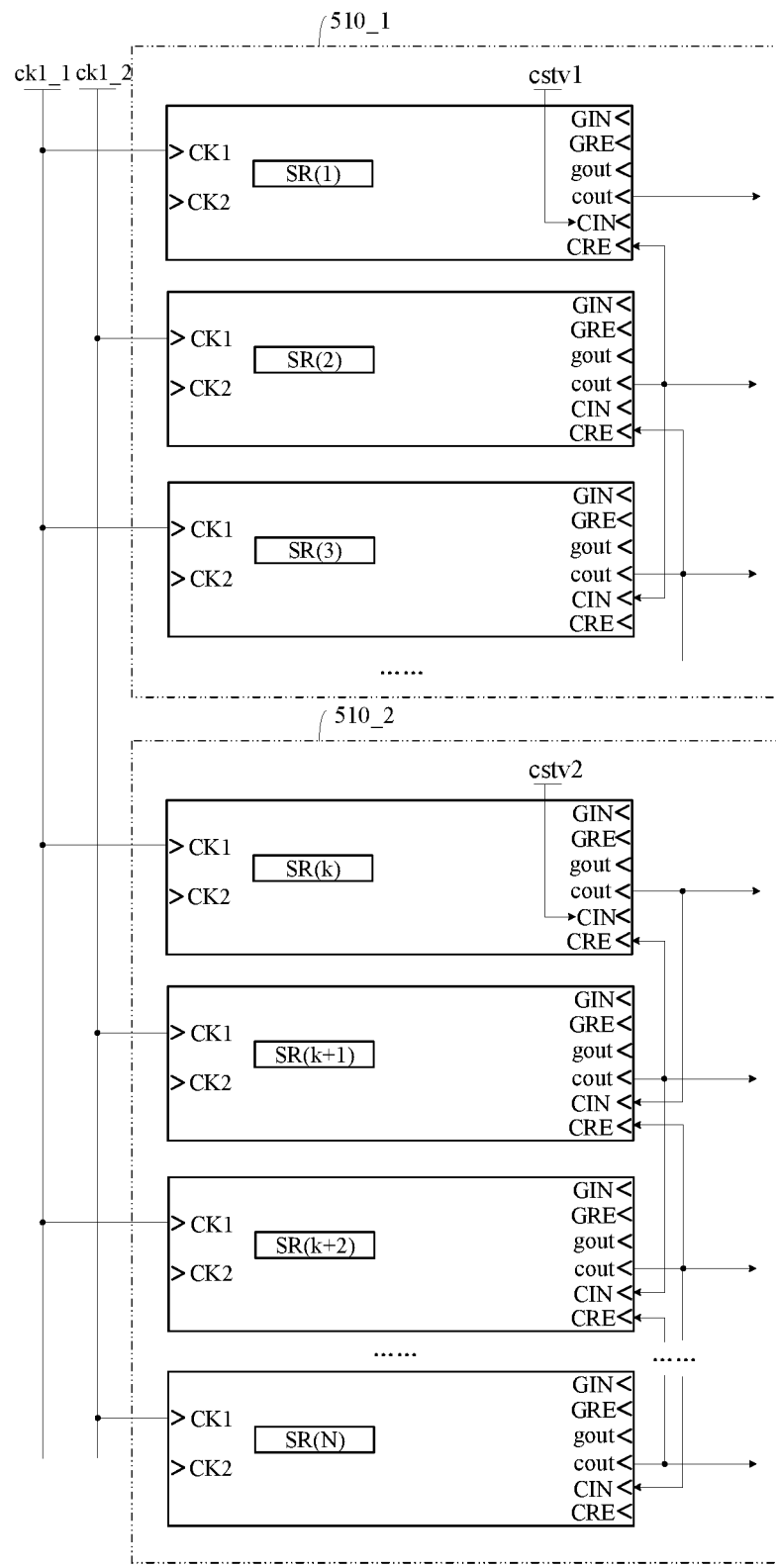
FIG. 11 is a third schematic structural diagram of a gate driving circuit in accordance with an embodiment of the disclosure.

Schematic structural diagrams of gate driving circuits corresponding to another implementations of the disclosure are shown as FIG. 11 and are transformed with specific to the implementations of parts of structures in FIG. 10. It only describes below the difference of the present implementation and the implementation as shown in FIG. 10, and the similarities thereof are omitted herein.

During implementation, as shown in FIG. 11, M may be set to be 2, that is, all the shift units are divided into two unit groups 510_1 and 510_2. Of course, M may also be set to be 3, 4, 5 and the like, and the specific numerical value of M may be designed and determined according to the actual application environment, but is not limited herein.

During implementation, each of the shift units SR(1)-SR(N) in the gate driving circuit may be set to be the above shift register provided by the embodiment of the disclosure. As shown in FIG. 11, the unit group 510_1 includes the first shift unit SR(1) to the (k−1)-th shift unit SR(k−1). The unit group 510_2 includes the k-th shift unit SR(k) to the N-th shift unit SR(N), wherein the value of k may be designed and determined according to the actual application environment, but is not limited herein.

In the unit group 510_1, the touch input signal CIN of the first shift unit SR(1) is provided by the touch triggering signal cstv1, and the touch reset signal CRE of the first shift unit SR(1) is provided by the touch scanning signal of the touch output terminal cout of the second shift unit SR(2). The touch input signal CIN of the second shift unit SR(2) is provided by the touch scanning signal of the touch output terminal cout of the first shift unit SR(1), and the touch reset signal CRE of the second shift unit SR(2) is provided by the touch scanning signal of the touch output terminal cout of the third shift unit SR(3). The rest may be done in the same manner, and the descriptions thereof are omitted herein.

In the unit group 510_2, a touch input signal CIN of the k-th shift unit SR(k) (namely the first shift unit in the unit group 510_2) is provided by a touch triggering signal cstv2. In addition, a touch reset signal CRE of the k-th shift unit SR(k) is provided by a touch scanning signal of a touch output terminal cout of a (k+1)-th shift unit SR(k+1). A touch input signal CIN of the (k+1)-th shift unit SR(k+1) is provided by a touch scanning signal of a touch output terminal cout of the k-th shift unit SR(k), and a touch reset signal CRE of the (k+1)-th shift unit SR(k+1) is provided by a touch scanning signal of a touch output terminal cout of a (k+2)-th shift unit SR(k+2). The rest may be done in the same manner, and the descriptions thereof are omitted herein.

Figure 12:
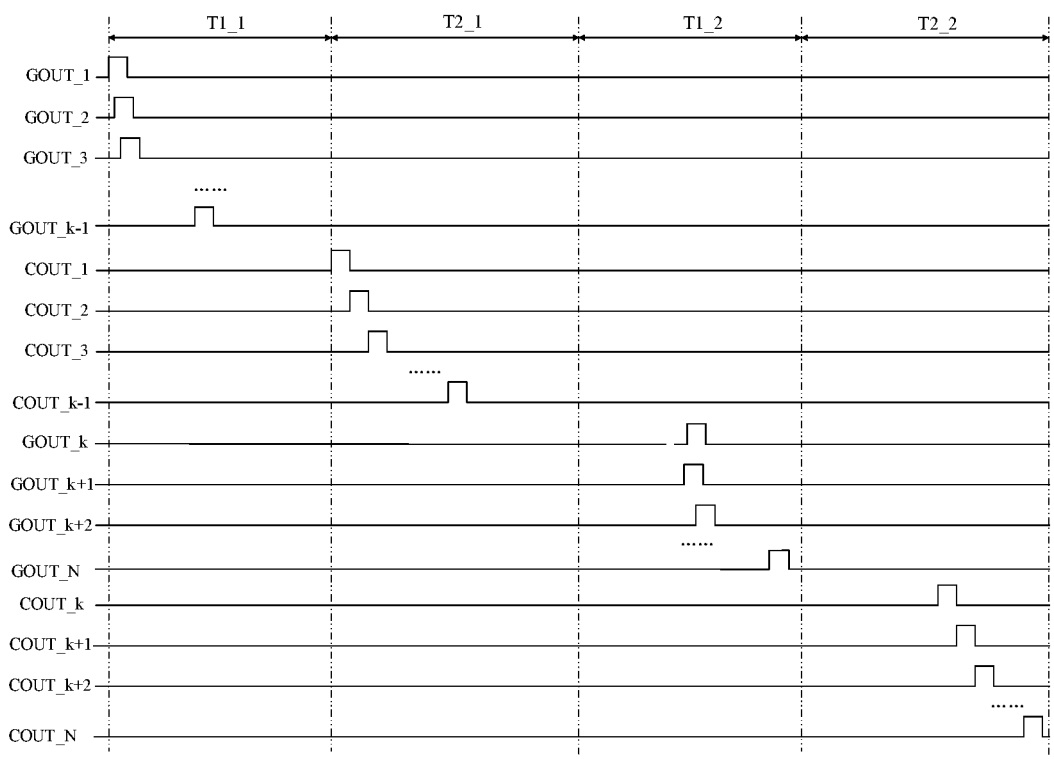
FIG. 12 is a third circuit timing diagram in accordance with an embodiment of the disclosure.

The operation process of the above gate driving circuit provided by the embodiment of the disclosure is described below by taking a structure as shown in FIG. 11 as an example in combination with a circuit timing diagram as shown in FIG. 12.

GOUT_1-GOUT_N respectively represent the gate scanning signals output by the scanning output terminals gout of the first shift unit SR(1) to the N-th shift unit SR(N). COUT_1-COUT_k−1 respectively represent the touch scanning signals output by the touch output terminals cout of the first shift unit SR(1) to the (k−1)-th shift unit SR(k−1), and COUT_k-COUT_N respectively represent the touch scanning signals output by the touch output terminals cout of the k-th shift unit SR(k) to the N-th shift unit, wherein one-frame display time may sequentially include a display scanning period T1_1, a touch period T2_1, a display scanning period T1_2 and a touch period T2_2. In the display scanning period T1_1, the gate driving circuit may output the gate scanning signals COUT_1-COUT_k−1, so that the connected gate lines are subjected to scanning driving. Then, the touch period T2_1 is reached, the gate driving circuit may output the touch scanning signals COUT_1-COUT_k−1 to control first transistors M1 in the first shift unit SR(1) to the (k−1)-th shift unit SR(k−1) to be sequentially turned on, so that the connected touch electrodes are subjected to touch driving. Then, in the display scanning period T1_2, the gate driving circuit may output the gate scanning signals GOUT_k-GOUT_N, so that the connected other gate lines are subjected to scanning driving. Then, the touch period T2_2 is reached, the gate driving circuit may output the touch scanning signals COUT_k-COUT_N to control first transistors M1 in the k-th shift unit SR(k) to the N-th shift unit SR(N) to be sequentially turned on, so that the connected other touch electrodes are subjected to touch driving. In this way, the processes of the touch periods may be inserted between the two display scanning periods.

Figure 13:
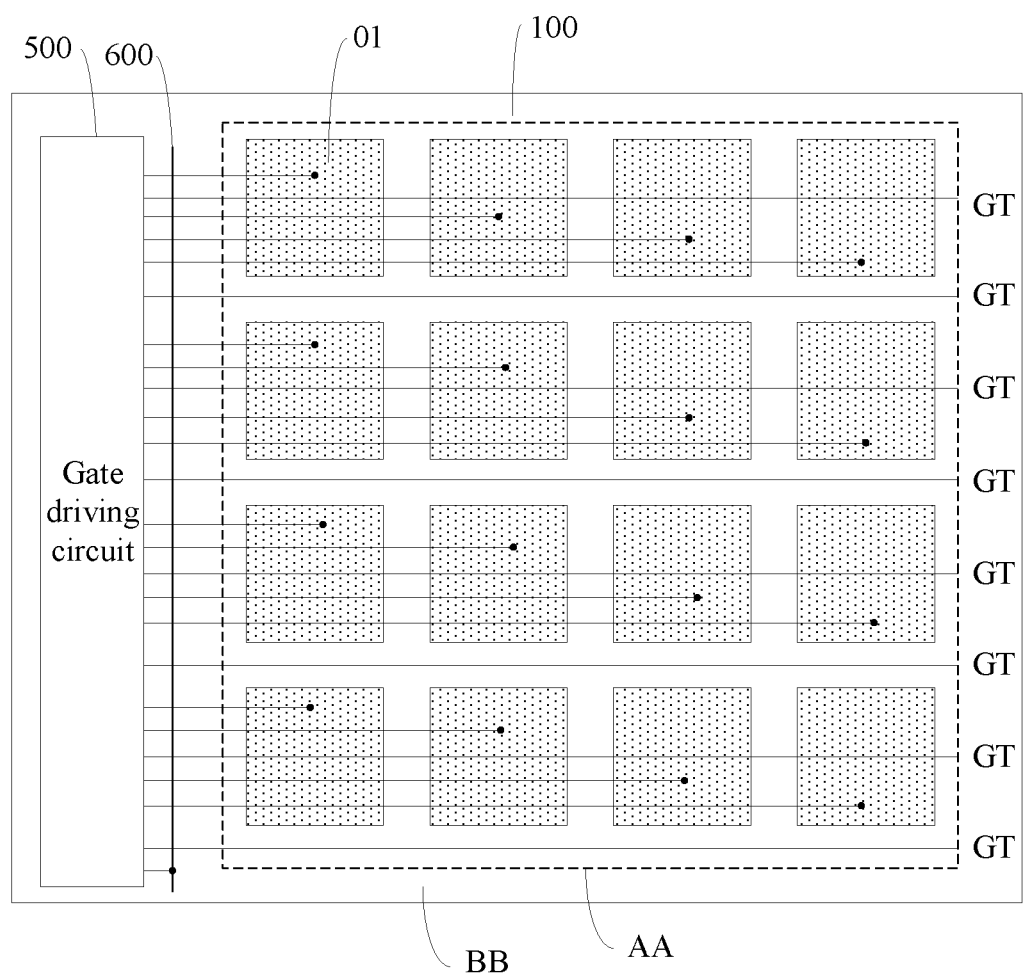
FIG. 13 is a first schematic structural diagram of an array substrate in accordance with an embodiment of the disclosure.
Figure 14:
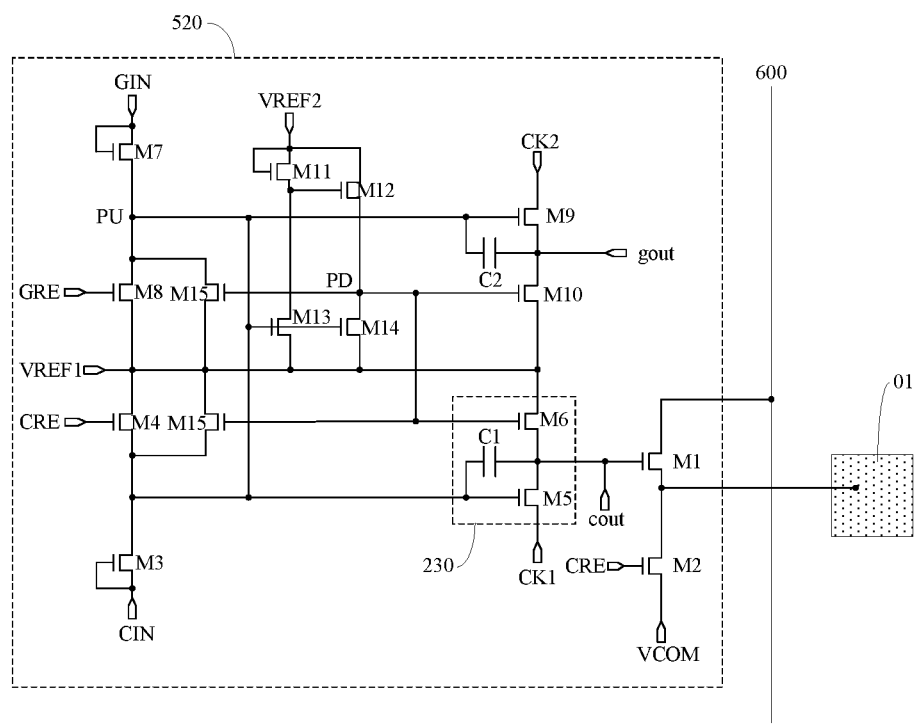
FIG. 14 is a first schematic diagram of a partially enlarged structure of an array substrate in accordance with an embodiment of the disclosure.

Based on the same inventive concept, the embodiment of the disclosure further provides an array substrate. As shown in FIG. 13 and FIG. 14, the array substrate may include a plurality of touch electrodes 01 in a display region AA, and the above gate driving circuit 500 according to the embodiment of the disclosure and a touch detection line 600 which are located in a non-display region BB. One of the touch electrodes 01 is electrically connected with one shift register 520 in the gate driving circuit 500 in a one-to-one correspondence; and a touch detection signal terminal of the shift register is electrically connected with the touch detection line, that is, a second electrode of a first transistor M1 is electrically connected with the touch detection line. The gate driving circuit in the embodiment of the disclosure outputs the gate scanning signal to perform scanning driving and electrically connects each of the touch electrodes with the touch detection line in a time-sharing manner to realize touch driving, so that the number of the arranged touch detection lines may be reduced, and furthermore, the area of a Fan-out region and the area of the non-display region are reduced.

The array substrate provided by the embodiment of the disclosure is described below in detail in combination with specific embodiments. It should be noted that the present embodiment is intended to better explain the disclosure, rather than to limit the disclosure.

Array substrates corresponding to some implementations of the disclosure have different requirements for the touch of the display device during specific implementation, so that the number of the touch electrodes arranged on the array substrates are also set to be different, and furthermore, the specific number of shift registers in gate driving circuits may be correspondingly set according to the number of the touch electrodes. In addition, the number of the touch electrodes in the array substrates may be designed and determined according to an actual application environment, but is not limited herein.

In the embodiment of the disclosure, as shown in FIG. 13, the display region AA further includes a plurality of gate lines GT, data lines and pixel units defined by the gate lines and the data lines. The number of the gate driving circuit 500 may be set to be one, and the number of the touch detection line 600 may be set to be one. In addition, all the shift registers are located at the same ends of the gate lines GT, for example, at the left side of the display region AA, and the gate lines GT are electrically connected with the gate driving circuit 500. Specifically, as shown in combination with FIG. 13 and FIG. 14, the array substrate is provided with wires one-to-one corresponding to the touch electrodes 01, the first transistors M1 in the shift registers 520 in the gate driving circuit 500 are electrically connected with the corresponding touch electrodes 01 by the wires, and the first transistors M1 in the shift registers 520 in the gate driving circuit 500 are electrically connected with the same touch detection line 600, so that each of the touch electrodes 01 is controlled to be electrically connected with the touch detection line 600 in a time sharing manner by the gate driving circuit 500, and furthermore, touch driving is performed.

An LCD (Liquid Crystal Display) panel has the characteristics such as a light and thin shape, power saving and no radiation so as to be widely applied. The operation principle of the LCD panel is that the arrangement state of liquid crystal molecules in a liquid crystal layer is changed by changing a voltage difference between two sides of the liquid crystal layer so that the light transmittance of the liquid crystal layer is changed to display an image. During implementation, in the embodiment of the disclosure, the array substrate may be applied to the LCD. In addition, the pixel unit includes a TFT and a pixel electrode. In this way, the common electrode may be arranged on the array substrate and is patterned, so that the plurality of touch electrodes which are independent from one another can be formed by the common electrode.

Electroluminescent diodes such as an OLED (Organic Light Emitting Diode), a Micro-LED (Micro Light Emitting Diode) and QLED (Quantum Dot Light Emitting Diodes) have the advantages such as self-illumination and low energy consumption, and during implementation, the array substrate may be applied to an electroluminescent diode display panel. In addition, the pixel unit can include an electroluminescent diode and a pixel circuit for driving the electroluminescent diode to emit light. In this way, the cathode of the electroluminescent diode may be used as the common electrode to be patterned, so that the plurality of touch electrodes which are independent from one another are formed by the common electrode.

Generally, the display device may achieve the touch function by using a self-capacitance touch technology. During implementation, the touch electrodes may be set as self-capacitance electrodes, so that the display device achieves the touch function by using the self-capacitance touch technology. In the embodiment of the disclosure, the self-capacitance electrodes in one row are respectively electrically connected with B adjacent shift registers, wherein B represents the total number of the self-capacitance electrodes in one row. Further, the self-capacitance electrode in each row may be respectively electrically connected with the B adjacent shift registers in sequence. As shown in FIG. 13, for example, B is 4, the total number of the self-capacitance electrodes in one row is 4, then the four self-capacitance electrodes in the row are respectively electrically connected with the four adjacent shift registers. With the gate driving circuit as shown in FIG. 10 as an example, the self-capacitance electrode in the first column in the first row may be electrically connected with the first transistor M1 of the shift register in the first shift unit SR(1). The self-capacitance electrode in the second column in the first row may be electrically connected with the first transistor M1 of the shift register in the second shift unit SR(2). The self-capacitance electrode in the third column in the first row may be electrically connected with the first transistor M1 of the shift register in the third shift unit SR(3). The self-capacitance electrode in the fourth column in the first row may be electrically connected with the first transistor M1 of the shift register in the fourth shift unit SR(4). The rest may be done in the same manner, and the descriptions thereof are omitted herein. Of course, each self-capacitance electrode in each row may also be correspondingly and electrically connected with the B adjacent shift registers according to any order, which is not limited herein.

The operation process of the above array substrate provided by the embodiment of the disclosure is described below by taking structures as shown in FIG. 10, FIG. 13 and FIG. 14 as examples in combination with the sequence diagram of the circuit as shown in FIG. 9.

In the display scanning period T1, the gate driving circuit sequentially outputs the gate scanning signals to the gate lines so as to perform scanning driving. For each gate line, when the shift register 520 outputs the high-level gate scanning signal to the gate line, the pixel unit corresponding to the gate line is turned on so that data signals transmitted on the data lines are input.

In the touch period T2, the gate driving circuit sequentially outputs touch scanning signals to the connected first transistors to sequentially perform touch driving on each touch electrode. For each touch electrode, when the shift register 520 correspondingly electrically connected with the touch electrode outputs the high-level touch scanning signal, the first transistor M1 in the shift register is turned on, to conduct the touch electrode with the touch detection line, and then, a second transistor M2 in the shift register 520 is turned on, to provide the common voltage signal VCOM are to the touch electrode 01. When the array substrate is applied to the display panel, the driving IC electrically connected with the touch detection line may also be arranged, so that the driving IC loads a touch signal to the touch electrode through the touch detection line and determines a touch position by detecting the variation of a capacitance value of the touch electrode when the touch electrode conducts with the touch detection line, and furthermore, the touch function is achieved.

Figure 15:
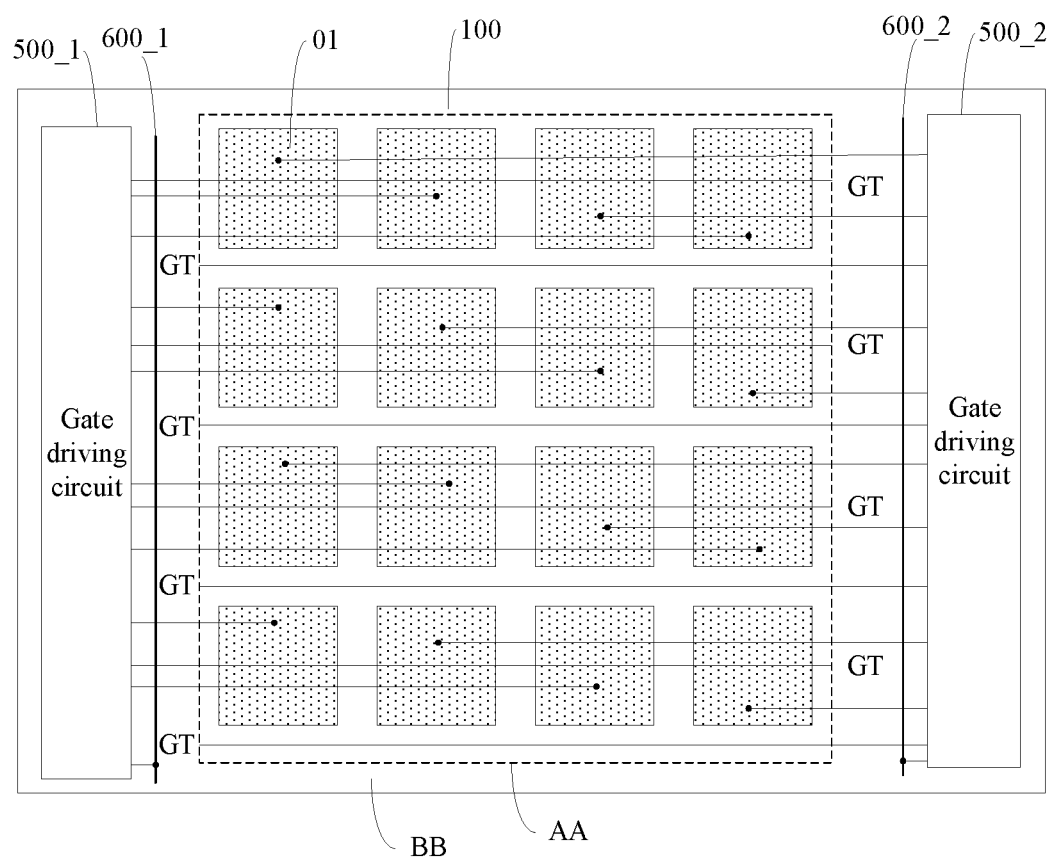
FIG. 15 is a second schematic structural diagram of an array substrate in accordance with an embodiment of the disclosure.

Schematic structural diagrams of array substrates corresponding to some other implementations of the disclosure are shown as FIG. 15 and are transformed with specific to the implementations of parts of structures in FIG. 13. It only describes below the difference of the present implementation and the implementation as shown in FIG. 13, and the similarities thereof are omitted herein.

During implementation, in the embodiment of the disclosure, as shown in combination with FIG. 14 and FIG. 15, the number of the gate driving circuits, namely 500_1 and 500_2, may be set to be two; and the number of the touch detection lines, namely 600_1 and 600_2, may be set to be two. The first gate driving circuit 500_1 in the two gate driving circuits is electrically connected with the first touch detection line 600_1 in the two touch detection lines, that is, the first transistor(s) M1 in a shift register 520 in the first gate driving circuit 500_1 is electrically connected with the same first touch detection line 600_1. The second gate driving circuit 500_2 is electrically connected with the second touch detection line 600_2 in the two touch detection lines. That is, the first transistor(s) M1 in a shift register 520 in the second gate driving circuit 500_2 is electrically connected with the same second touch detection line 600_2.

During implementation, in the embodiment of the disclosure, as shown in FIG. 15, the display region AA further includes a plurality of gate lines GT, the first gate driving circuit 500_1 is located at one end of each of the gate lines GT, and the second gate driving circuit 500_2 is located at the other end of each of the gate lines GT. For example, the first gate driving circuit 500_1 is located in the non-display region BB at the left side of the display region AA, and the second gate driving circuit 500_2 is located in the non-display region BB at the right side of the display region AA.

Figure 16:
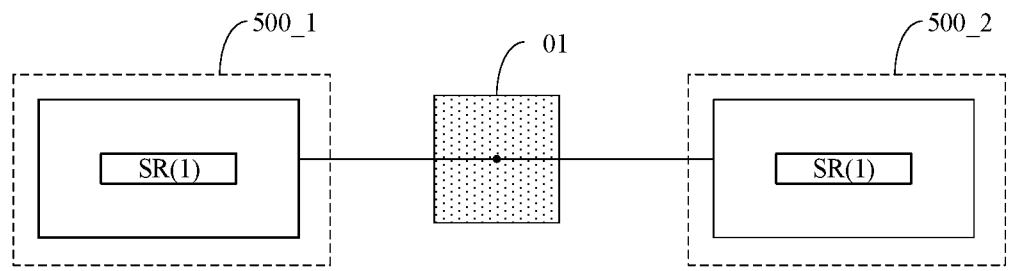
FIG. 16 is a second schematic diagram of a partially enlarged structure of an array substrate in accordance with an embodiment of the disclosure.

During implementation, in the embodiment of the disclosure, as shown in FIG. 16, the same touch electrode 01 is electrically connected with one shift register in the first gate driving circuit 500_1 and one shift register in the second gate driving circuit 500_2. The timings of gate scanning signals and touch scanning signals output by the shift registers electrically connected with the same touch electrode 01 are same. For example, as shown in FIG. 16, the touch electrode 01 is electrically connected with the shift register in a first shift unit SR(1) in the first gate driving circuit 500_1 and the shift register in a first shift unit SR(1) in the second gate driving circuit 500_2. The rest may be done in the same manner, and there are no limits herein.

During implementation, in the embodiment of the disclosure, as shown in FIG. 15, the first gate driving circuit 500_1 may be electrically connected with the odd-numbered row of gate lines GT, and the second gate driving circuit 500_2 may be electrically connected with the even-numbered row of gate lines GT. Of course, one gate line may also be electrically connected with one shift unit in the first gate driving circuit 500_1 and one shift unit in the second gate driving circuit 500_2, and the timings of gate scanning signals output by the shift units electrically connected with the same gate line are same.

During implementation, in the embodiment of the disclosure, as shown in FIG. 15, a part of the touch electrodes 01 are correspondingly electrically connected with the shift registers in the first gate driving circuit 500_1, and the other touch electrodes 01 are correspondingly electrically connected with the shift registers in the second gate driving circuit 500_2.

During implementation, the touch electrodes may be self-capacitance electrodes, in the embodiment of the disclosure, as shown in FIG. 15, in the same row, a part of the self-capacitance electrodes are correspondingly electrically connected with the shift registers in the first gate driving circuit 500_1, and the other self-capacitance electrodes are correspondingly electrically connected with the shift registers in the second gate driving circuit 500_2. For example, as shown in FIG. 15, in the first row, a part of the self-capacitance electrodes are correspondingly electrically connected with the first gate driving circuit 500_1, and the other self-capacitance electrodes are correspondingly electrically connected with the shift registers in the second gate driving circuit 500_2. The rest may be done in the same manner, and there are no limits herein.

During implementation, in the embodiment of the disclosure, as shown in FIG. 15, in at least one row, the odd-numbered column of self-capacitance electrodes are correspondingly electrically connected with the shift registers in the first gate driving circuit 500_1, and the even-numbered column of self-capacitance electrodes are correspondingly electrically connected with the shift registers in the second gate driving circuit 500_2.

Further, as shown in FIG. 15, in every two adjacent rows, the gate driving circuits connected with the same column of self-capacitance electrodes are different. For example, in the first row, the even-numbered column of self-capacitance electrodes are correspondingly electrically connected with the shift registers in the first gate driving circuit 500_1, and the odd-numbered column of self-capacitance electrodes are correspondingly electrically connected with the shift registers in the second gate driving circuit 500_2. In the second row, the odd-numbered column of self-capacitance electrodes are correspondingly electrically connected with the shift registers in first gate driving circuit 500_1, and the even-numbered column of self-capacitance electrodes are correspondingly electrically connected with the shift registers in second gate driving circuit 500_2. The rest may be done in the same manner, and there are no limits herein.

Figure 17:
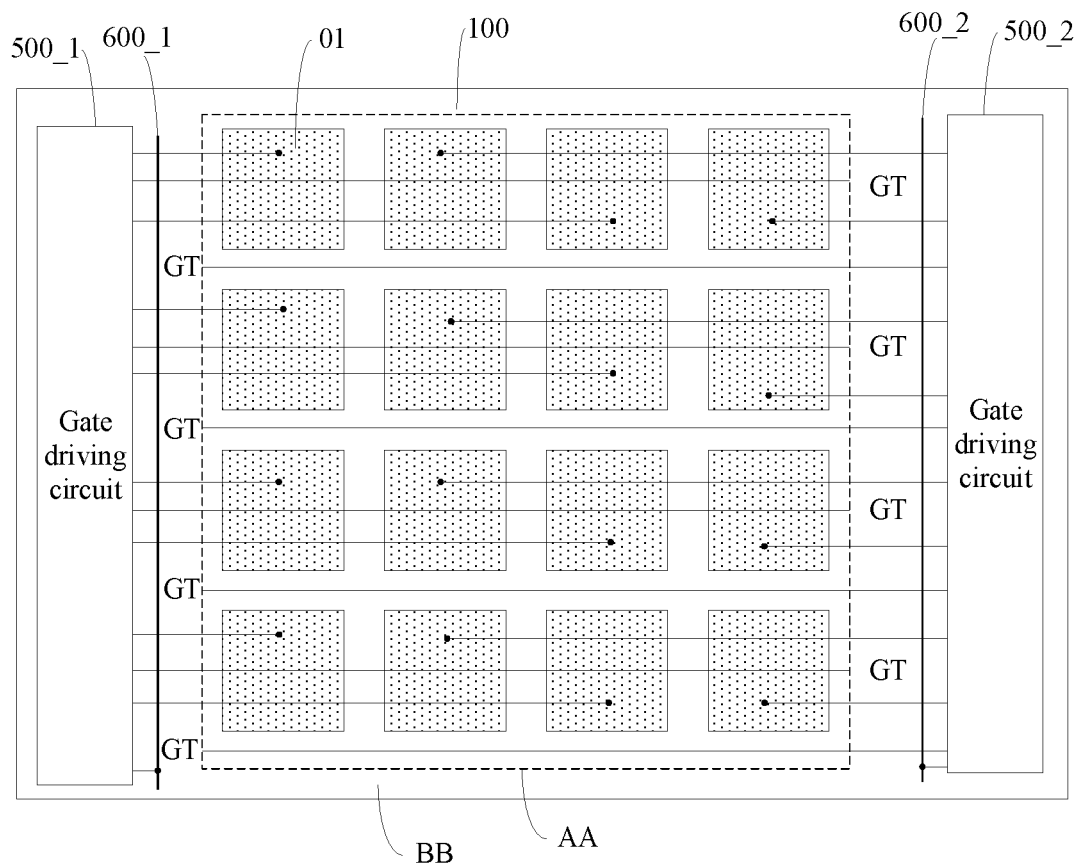
FIG. 17 is a third schematic structural diagram of an array substrate in accordance with an embodiment of the disclosure.

Further, as shown in FIG. 17, the gate driving circuits connected with the same column of self-capacitance electrodes are same. For example, the odd-numbered column of self-capacitance electrodes in each row are correspondingly electrically connected with the shift registers in the first gate driving circuit 500_1, and the even-numbered column of self-capacitance electrodes in each row are correspondingly electrically connected with the shift registers in the second gate driving circuit 500_2.

Figure 18:
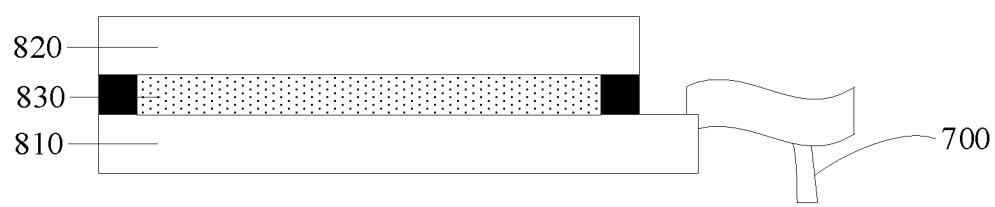
FIG. 18 is a schematic structural diagram of a display device in accordance with an embodiment of the disclosure.

Based on the same concept, the embodiment of the disclosure further provides the display device, as shown in combination with FIG. 13, FIG. 15, FIG. 17 and FIG. 18, the display device may include a driving chip 700 and any above array substrate 810, wherein the driving chip 700 is electrically connected with the touch detection line 600 (600 in FIG. 13, 600_1 in FIGS. 15 and 600_2 in FIG. 17). FIG. 18 is described by taking the LCD panel as an example, the LCD panel further includes an opposite substrate 820 arranged to be opposite to the array substrate 810 and the liquid crystal layer 830 between the array substrate 810 and the opposite substrate 820.

During specific implementation, the display device may be any product or part with a display function, such as a mobile phone, a tablet personal computer, a television, a display, a notebook computer, a digital photo frame and a navigator. Other essential components of the display device are all regarded to be provided by the ordinary skilled in the art so as not to be repeatedly described herein and not to be regarded as a limit to the disclosure.

According to the above shift register, driving method thereof, gate driving circuit, array substrate and display device provided by the embodiments of the disclosure, the shift register sub-circuit outputs the gate scanning signal, to drive the gate lines. The shift register sub-circuit outputs the touch scanning signal to the touch control circuit, so that the touch control circuit conducts the touch electrode and the touch detection signal terminal in response to the touch scanning signal, and thus, touch driving may be performed. Therefore, the above shift register provided by the embodiment of the disclosure is not only capable of realizing scanning driving, but also capable of realizing the touch driving of the touch electrode. In addition, the number of the arranged touch detection line may be reduced, and furthermore, the area of the Fan-out region and the area of the non-display region are reduced.

Obviously, those skilled in the art can make various modifications and variations on the embodiments of the disclosure without departing from the spirit and scope of the disclosure. Thus the disclosure is also intended to encompass these modifications and variations therein as long as these modifications and variations come into the scope of the claims of the disclosure and their equivalents.

The invention claimed is:

1. A shift register, comprising a shift register sub-circuit and a touch control circuit, the touch control circuit being configured to be electrically connected with one touch electrode;
wherein the shift register sub-circuit is configured to output a gate scanning signal, and output a touch scanning signal to the touch control circuit; and
the touch control circuit is electrically connected with the shift register sub-circuit and is configured to conduct the touch electrode with a touch detection signal terminal in response to the touch scanning signal;
wherein the shift register sub-circuit comprises:
a touch input reset circuit configured to provide a touch input signal to a pull-up node in response to the touch input signal, and provide a first reference signal to the pull-up node in response to a touch reset signal;
wherein the touch input reset circuit comprises a third transistor and a fourth transistor;
a gate of the third transistor is electrically connected with a first electrode of the third transistor and is configured to receive the touch input signal, and a second electrode of the third transistor is electrically connected with the pull-up node; and
a gate of the fourth transistor is configured to receive the touch reset signal, a first electrode of the fourth transistor is configured to receive the first reference signal, and a second electrode of the fourth transistor is electrically connected with the pull-up node.

2. The shift register according to claim 1, wherein the touch control circuit comprises a first transistor; and
a gate of the first transistor is configured to receive the touch scanning signal, a first electrode of the first transistor is electrically connected with the corresponding touch electrode, and a second electrode of the first transistor is electrically connected with the touch detection signal terminal.

3. The shift register according to claim 1, further comprising a touch reset circuit electrically connected with the touch electrode; and
the touch reset circuit is configured to provide a common voltage signal to the touch electrode in response to the touch reset signal;
wherein the touch reset circuit comprises a second transistor; and a gate of the second transistor is configured to receive the touch reset signal, a first electrode of the second transistor is configured to receive the common voltage signal, and a second electrode of the second transistor is electrically connected with the corresponding touch electrode.

4. The shift register according to claim 1, wherein the shift register sub-circuit further comprises a scanning shift register circuit and a touch output circuit;
the scanning shift register circuit is configured to output the gate scanning signal at least in response to a scanning input signal, a scanning reset signal, a signal of the pull-up node and a signal of a pull-down node; and
the touch output circuit is configured to provide a first clock signal to a touch output terminal in response to the signal of the pull-up node, and provide the first reference signal to the touch output terminal in response to the signal of the pull-down node, to output the touch scanning signal to the touch control circuit.

5. The shift register according to claim 4, wherein the touch output circuit comprises a fifth transistor, a sixth transistor and a first capacitor;
a gate of the fifth transistor is electrically connected with the pull-up node, a first electrode of the fifth transistor is configured to receive the first clock signal, and a second electrode of the fifth transistor is electrically connected with the touch output terminal;
a gate of the sixth transistor is electrically connected with the pull-down node, a first electrode of the sixth transistor is configured to receive the first reference signal, and a second electrode of the sixth transistor is electrically connected with the touch output terminal; and
the first capacitor is connected between the pull-up node and the touch output terminal.

6. The shift register according to claim 4, wherein the scanning shift register circuit comprises a scanning input reset circuit, a node control circuit and a scanning output circuit;
the scanning input reset circuit is configured to provide the scanning input signal to the pull-up node in response to the scanning input signal, and provide the first reference signal to the pull-up node in response to the scanning reset signal;
the node control circuit is configured to make levels of the pull-up node and the pull-down node opposite; and
the scanning output circuit is configured to provide a second clock signal to a scanning output terminal in response to the signal of the pull-up node, and provide the first reference signal to the scanning output terminal in response to the signal of the pull-down node, to output the gate scanning signal.

7. The shift register according to claim 6, wherein the scanning input reset circuit comprises a seventh transistor and an eighth transistor, wherein a gate and a first electrode of the seventh transistor are configured to receive the scanning input signal, and a second electrode of the seventh transistor is electrically connected with the pull-up node; and a gate of the eighth transistor is configured to receive the scanning reset signal, a first electrode of the eighth transistor is configured to receive the first reference signal, and a second electrode of the eighth transistor is electrically connected with the pull-up node;

the scanning output circuit comprises a ninth transistor, a tenth transistor and a second capacitor, wherein a gate of the ninth transistor is electrically connected with the pull-up node, a first electrode of the ninth transistor is configured to receive the second clock signal, and a second electrode of the ninth transistor is electrically connected with the scanning output terminal; a gate of the tenth transistor is electrically connected with the pull-down node, a first electrode of the tenth transistor is configured to receive the first reference signal, and a second electrode of the tenth transistor is electrically connected with the scanning output terminal; and the second capacitor is connected between the pull-up node and the scanning output terminal; and the node control circuit comprises an eleventh transistor, a twelfth transistor, a thirteenth transistor, a fourteenth transistor and a fifteenth transistor, wherein a gate and a first electrode of the eleventh transistor are configured to receive a second reference signal, and a second electrode of the eleventh transistor is electrically connected with a gate of the twelfth transistor; a first electrode of the twelfth transistor is configured to receive the second reference signal, and a second electrode of the twelfth transistor is electrically connected with the pull-down node; a gate of the thirteenth transistor is electrically connected with the pull-up node, a first electrode of the thirteenth transistor is configured to receive the first reference signal, and a second electrode of the thirteenth transistor is electrically connected with the gate of the twelfth transistor; a gate of the fourteenth transistor is electrically connected with the pull-up node, a first electrode of the fourteenth transistor is configured to receive the first reference signal, and a second electrode of the fourteenth transistor is electrically connected with the pull-down node; and a gate of the fifteenth transistor is electrically connected with the pull-down node, a first electrode of the fifteenth transistor is configured to receive the first reference signal, and a second electrode of the fifteenth transistor is electrically connected with the pull-up node.

8. A driving method of the shift register according to claim 1, comprising a display scanning period and a touch period;

in the display scanning period, the shift register sub-circuit outputs the gate scanning signal; and in the touch period, the shift register sub-circuit outputs the touch scanning signal to the touch control circuit; and the touch control circuit conducts the touch electrode with the touch detection signal terminal in response to the touch scanning signal.

9. A gate driving circuit, comprising a plurality of cascaded shift units, wherein the shift units are divided into one or more unit groups;

at least two shift units in at least one of the unit groups are the shift register according to claim 1, wherein a touch input signal of a first shift register in each of the unit groups is provided by one of touch triggering signals, the touch triggering signals one-to-one correspond to the first shift registers in the unit groups; and in every two adjacent shift registers in a same unit group, a touch input signal of a second shift register is provided by a touch scanning signal of the first shift register.

10. The gate driving circuit according to claim 9, wherein in the every two adjacent shift registers in the same unit group, a touch reset signal of the first shift register is provided by a touch scanning signal of the second shift register.

11. The gate driving circuit according to claim 9, wherein in the same unit group, nonadjacent shift units are the shift register according to claim 1; or in the same unit group, each of the shift units is the shift register according to claim 1.

12. The gate driving circuit according to claim 9, wherein in every four adjacent shift units, a scanning input signal of a fourth shift unit is provided by a gate scanning signal of a first shift unit, and a scanning reset signal of the first shift unit is provided by a gate scanning signal of the fourth shift unit.

13. An array substrate, comprising: a plurality of touch electrodes in a display region, and the gate driving circuit according to claim 9 and a touch detection line in a non-display region;

wherein the touch electrodes are electrically connected with the shift registers in the gate driving circuit in a one-to-one correspondence; and touch detection signal terminals of the shift registers are electrically connected with the touch detection line.

14. The array substrate according to claim 13, wherein the display region further comprises a plurality of gate lines, the number of the gate driving circuit is one, and the number of the touch detection line is one; and all the shift registers are at same ends of the gate lines;

wherein the touch electrodes are self-capacitance electrodes; and the self-capacitance electrodes in one row are electrically connected with B adjacent shift registers respectively, wherein B represents a total number of the self-capacitance electrodes in one row.

15. The array substrate according to claim 13, wherein the number of the gate driving circuits is two; the number of the touch detection lines is two; and a first gate driving circuit in the two gate driving circuits is electrically connected with a first touch detection line in the two touch detection lines, and a second gate driving circuit is electrically connected with a second touch detection line in the two touch detection lines;

wherein the display region further comprises a plurality of gate lines, the first gate driving circuit is at one end of the gate lines, and the second gate driving circuit is at the other end of the gate lines.

16. The array substrate according to claim 15, wherein a same touch electrode is electrically connected with one shift register in the first gate driving circuit and one shift register in the second gate driving circuit.

17. The array substrate according to claim 15, wherein a part of the touch electrodes are electrically connected with the shift registers in the first gate driving circuit, and the other touch electrodes are electrically connected with the shift registers in the second gate driving circuit.

18. The array substrate according to claim 17, wherein the touch electrodes are self-capacitance electrodes; and in a same row, a part of the self-capacitance electrodes are electrically connected with shift register units in the first gate driving circuit, and the other self-capacitance electrodes are electrically connected with shift register units in the second gate driving circuit;

wherein in at least one row, an odd-numbered column of self-capacitance electrodes are electrically connected with the shift registers in the first gate driving circuit, and an even-numbered column of self-capacitance electrodes are electrically connected with the shift registers in the second gate driving circuit.

19. A display device, comprising a driving chip and the array substrate according to claim 13, wherein the driving chip is electrically connected with the touch detection line.

* * * * *